(12) United States Patent
Taniguchi et al.

(10) Patent No.: US 6,496,257 B1
(45) Date of Patent: Dec. 17, 2002

(54) PROJECTION EXPOSURE APPARATUS AND METHOD

(75) Inventors: Tetsuo Taniguchi, Ageo (JP); Masayuki Murayama, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/577,020

(22) Filed: May 22, 2000

Related U.S. Application Data

(63) Continuation of application No. PCT/JP98/05258, filed on Nov. 20, 1998.

(30) Foreign Application Priority Data

Nov. 21, 1997 (JP) .............................................. 9-338109
Mar. 30, 1998 (JP) ............................................ 10-083724

(51) Int. Cl.[7] .............................................. G01N 21/88
(52) U.S. Cl. ...................... 356/239.2; 359/507; 355/30
(58) Field of Search ........................ 355/30; 356/239.2; 359/507

(56) References Cited

U.S. PATENT DOCUMENTS

| | | | | |
|---|---|---|---|---|
| 4,021,120 A | * | 5/1977 | Muller et al. ............... | 356/442 |
| 4,074,217 A | * | 2/1978 | Yanagawa .................... | 355/30 |
| 4,365,877 A | * | 12/1982 | Shaw .......................... | 352/184 |
| 4,365,896 A | * | 12/1982 | Mihalow ................... | 356/239.8 |
| 4,896,047 A | * | 1/1990 | Weaver et al. ............... | 250/573 |
| 5,088,083 A | * | 2/1992 | Olson .......................... | 369/71 |
| 5,229,602 A | * | 7/1993 | Juliger ..................... | 250/222.2 |
| 5,812,270 A | * | 9/1998 | Hampton et al. ........ | 356/237.1 |
| 5,929,981 A | * | 7/1999 | Keilbach ..................... | 356/73 |
| 6,268,904 B1 | | 7/2001 | Mori et al. | |

FOREIGN PATENT DOCUMENTS

| | | |
|---|---|---|
| JP | 3-127814 | 5/1991 |
| JP | 3-261127 | 11/1991 |
| JP | 4-365050 | 12/1992 |
| JP | 06140304 | 5/1994 |
| JP | 07142319 | 6/1995 |
| JP | 9-260257 | 10/1997 |
| JP | 09298148 | 11/1997 |
| JP | 10-116766 | 5/1998 |
| JP | WO99/27568 | 6/1999 |
| WO | WO98/57213 | 12/1998 |
| WO | WO99/05710 | 2/1999 |

* cited by examiner

*Primary Examiner*—Richard A. Rosenberger
(74) *Attorney, Agent, or Firm*—Oblon, Spivak, McClelland, Maier & Neustadt. P.C.

(57) ABSTRACT

Pattern transfer can be performed with improved exposure accuracy, by reducing the contamination caused by the attachment of a photosensitive agent or the like on an optical member of a projection optical member or the like. The pattern transfer onto a substrate W is performed after cleaning the objective member OB disposed at a given position by a cleaning device 8 at the time when pattern transfer is not performed, or while making flow a gas in a space between the substrate W and the optical member OB by a contamination protection device 98. Alternatively, the optical member OB disposed at a given position is inspected for contamination by a contamination inspection device 84 at the time when pattern transfer is not performed, and the pattern transfer or the cleaning or replacement of the optical member is performed based on the result.

25 Claims, 20 Drawing Sheets

PROJECTION EXPOSURE APPARATUS AND METHOD

CROSS-REFERENCE TO RELATED APPLICATIONS

This application claims priority to International Application No. PCT/JP98/05258 filed Nov. 20, 1998 and Japanese Application nos. 9-338109 filed Nov. 21, 1997; 10-083724 filed Mar. 30, 1998, and the entire content of both applications is hereby incorporated by reference.

The present invention is based on the Japanese Patent Application Nos. 9-338109 and 10-83724, which are incorporated herein by reference in their entirety.

FIELD OF THE INVENTION

The present invention relates to a projection exposure apparatus and a projection exposure method. More specifically, the present invention relates to a projection exposure apparatus and a projection exposure method both useful for projection exposure of a pattern defined on a mask onto a substrate in the manufacture of a semiconductor device, a liquid crystal display device or the like by a photolithography process.

BACKGROUND OF THE INVENTION

In a projection exposure apparatus used in a photolithography process for the manufacturing a semiconductor device, a liquid crystal display device, a thin-film magnetic head or the like, a circuit pattern with fine and narrow line width formed on a mask (e.g., a reticle) is projectionally exposed onto a photosensitive substrate (e.g., a wafer; hereinafter, a "wafer" is used an exemplary substrate for the description below) with a resist layer applied thereon, via a projection optical system with a high resolution. A wafer stage is moved vertically (i.e., upward and downward) along the optical axis of the projection optical system to align the wafer surface on the wafer stage to the focal position of the projection optical system. The wafer stage is then moved in specific directions two-dimensionally on a plane orthogonal to the optical axis of the projection optical system. For example, in a step-and-repeat type of projection exposure apparatus, the wafer stage is stopped at such a position that the center of the exposure field (i.e., the optical axis) of the projection optical system coincides with the center of each shot region on the wafer, where the exposure operation is performed. In such a projection exposure process, a photosensitive resin (e.g., a novolak resin) is usually applied on the wafer as the resist layer.

Recently, in such a type of apparatus, for addressing the demand for a more miniscule circuit patterns, the resolution of the apparatus has been improved. For this purpose, a light with a short wavelength in the UV zone has been generally used as the exposure illumination light. It has also been demanded to improve the workability of the projection exposure apparatus, which depends on the exposure time period. For this purpose, an exposure illumination light with a high illuminance has been used to shorten the exposure time period. Therefore, for pattern transfer, the surface of the substrate (e.g., a wafer, a glass plate) applied with a photosensitive agent (e.g., a photoresist) is irradiated with a light with a high energy density.

When a light with a high energy density is irradiated onto the surface of the substrate applied with a photosensitive agent, so-called "ablation" may occur in which the photosensitive agent or a reduction product thereof (hereinafter, referred to as a "photosensitive agent or the like") is scattered or vaporized and then evaporated. During the projection exposure process, the photosensitive agent released from the substrate partly reaches onto the optical member disposed in the vicinity of the substrate, and deposited on the surface opposed to the substrate (hereinafter, simply referred to as the "substrate-opposed surface) of the optical member, sometimes resulting in contamination of the surface of the optical member.

The deposits (e.g., a photosensitive agent or the like) on an optical member exhibit the behavior of optical contamination on the optical member. For example, in the case of an optical member as a component of a projection optical system, at the time of pattern transfer, the illuminance on an area of the substrate surface (applied with a photosensitive agent) corresponding to the contaminated area of the optical member may be decreased compared to that corresponding to the non-contaminated area of the optical member. That is, regional unevenness in amount of exposure light may occur in the pattern transferred onto the substrate surface applied with a photosensitive agent. As a result, for example, the line of a pattern designed to have an even line width may be transferred unevenly. For the manufacture of an integrated circuit pattern, such uneven pattern line transfer may ultimately cause functional failure of the finished product.

In addition, when the deposits on the optical member can absorb the illumination light, the temperature of the optical member is increased as the deposits are heated by the absorption of the illumination light during pattern transfer. Consequently, the optical characteristics of the optical member are altered, ultimately resulting in the alternation of the total imaging characteristics of the entire projection optical system.

In order to overcome this defect, in a projection exposure apparatus, it has been conventionally required to wipe the surface of an optical member of a projection optical system by an operator manually (cleaning process). It has also be proposed to provide a replaceable cover glass or polymer film between an optical member and a wafer to thereby prevent the approach of contaminants to the optical member (Japanese Patent Application Laid-open No. 6-140304).

It is the recent trend to increase the numerical aperture (NA) of a projection optical system to the maximum for the purpose of increasing the resolution of the system to the maximum. In this case, the maximum of the incident angle of the exposure illumination light upon the wafer is more increased. Then, it has been proposed to bring the projection optical system close to the wafer at the time of pattern transfer, thereby decreasing the diameter of the optical system of the exposure apparatus. This technique is also beneficial for the reduction in aberration for optical design of the exposure apparatus.

However, when the projection optical system is brought closer to the wafer at the time of pattern transfer, the deposition of contaminants (e.g., a photosensitive agent and the like) are released from the wafer onto the optical member of the projection optical member. Thus, the contamination of the optical member in the projection optical system is a serous problem. Moreover, the use of an exposure illumination light with a shorter wavelength and a higher illuminance for the purpose of improving resolution and workability of the apparatus makes this problem more serious.

In a prior art technique for disposing a replaceable contamination protection member between a projection optical system and a wafer, the space between the projection optical system and the exposure surface of the wafer has a threelayered structure, at the time of pattern transfer, which consists of a layer of the atmosphere between the projection optical system and the contamination protection member, a layer of the contamination protection member, and a layer of the atmosphere between the contamination protection member and the exposure surface of the wafer. Therefore, there is a limitation in bringing the projection optical system close to the wafer at the time of pattern transfer.

In addition, because of the increased demand for high transfer accuracy, the installation repeatability for a replaceable contamination protection member and the permissible optical variability of the contamination protection member become very critical. Therefore, the application of a cover glass (which has an even thickness) as the replaceable contamination protection means has its limit. That is, when a contamination protection member is replaced with a new one, it is inevitable to re-adjust the total aberration balance of the projection optical system; which is not suitable for practical use.

When a polymer film is used as the replaceable contamination protection member, the re-adjustment of the aberration balance of the projection optical system is not necessary. However, among the components of the exposure illumination light, the transmittance on the film of components having a large incident angle upon a polymer film are decreased. Particularly, the transmittance of an S-polarized light (which is largely responsible for an imaging characteristic) is remarkably increased, resulting in poor imaging performance. Moreover, a polymer film is generally difficult to be applied with an anti-reflection coating; which is not also suitable for practical use.

Under these circumstances, the present invention has been accomplished. The first object of the projection exposure apparatus according to the present invention, therefore, is to provide a projection exposure apparatus with improved precision by reducing the contamination caused by the deposition of a photosensitive agent or the like on an optical member of a projection optical system or the like.

The second object of the projection exposure apparatus according to the present invention is to provide a projection exposure apparatus with improved accuracy, by cleaning an optical member of a projection optical system or the like at the time when pattern transfer is not performed.

The third object of the projection exposure apparatus according to the present invention is to provide a projection exposure apparatus with improved accuracy by inspecting an optical member of a projection optical system or the like for contamination and, based on the inspection result, cleaning or replacing the optical member at the time when pattern transfer is not performed.

The fourth object of the projection exposure apparatus according to the present invention is to provide a projection exposure apparatus with improved accuracy by protecting an optical member of a projection optical system or the like for contamination during pattern transfer is performed.

The object of the projection exposure method according to the present invention is to provide a projection exposure method for performing the pattern transfer operation satisfactorily under the condition where the contamination caused by the deposition of a photosensitive agent or the like on an optical member of a projection optical system is reduced.

SUMMARY OF THE INVENTION

The invention is directed to a projection exposure apparatus for transferring a pattern defined on a mask onto a wafer via a projection optical system, the apparatus including a cleaning device for cleaning an optical member disposed at a given position.

According to the projection exposure apparatus of the present invention, the contamination of the substrate-opposed surface of the optical member at the time of pattern transfer can be reduced and the exposure accuracy can be improved by, prior to the pattern transfer, removing the contaminants (e.g., a photosensitive agent), caused by the previous pattern transfer, on the substrate-opposed surface of the optical member arranged at the predetermined position in the vicinity of the exposure surface of the substrate.

The cleaning may be performed every time pattern transfer is performed. However, if the contamination of the optical member caused by one pattern transfer is very small, then the cleaning may be performed at any time when the contamination level falls within a predetermined permissible range, for example, every time pattern transfer is performed for a predetermined number of times, or at regular intervals.

In the projection exposure apparatus of the present invention, various configurations may be employed. For example, the cleaning device may be disposed on a stage for holding the substrate, or the cleaning device may be mounted on a movable mechanism distinct from the stage for holding the substrate.

According to the projection exposure apparatus of the present invention, the cleaning member necessary for the cleaning operation can be driven by a conventionally employed stage which is for holding the substrate and is used for moving the substrate for performing pattern transfer. Therefore, the cleaning operation can be performed in a simple manner.

In the projection exposure apparatus of the present invention, it is preferable that the cleaning device be mounted on a vertical movement drive device provided on the stage.

According to the projection exposure apparatus of the present invention, the cleaning device and the optical member can be placed in contact with each other or [separate] can be separated from each other by a drive device.

According to the projection exposure apparatus of the present invention, the cleaning device is moved to the cleaning position by a movement mechanism distinct from the stage for holding the substrate. Therefore, both the cleaning function and the pattern transfer function are performed while maintaining the accuracy and the cleanliness of the stage for holding the substrate.

According to the projection exposure apparatus of the present invention, various types of cleaning devices may be employed. For example, the cleaning device may comprise an ultrasonic cleaning device for ultrasonically cleaning a part to be cleaned of the optical member by immersing the part in a cleaning solution with ultrasonic vibration. Alternatively, the cleaning device may comprise a cleaning member which contacts the substrate-opposed surface of the optical member to the substrate-opposed surface or the cleaning device may comprise a solution injector for emitting a cleaning solution onto the substrate-opposed surface of the optical system.

In the projection exposure apparatus of the present invention, it is preferable that the cleaning device is a soft member which has a surface to be placed in contact with the substrate-opposed surface so that it causes no damage to the optical member when they are in contact with each other. The cleaning device may be further provided with a drive unit for driving the cleaning member so that the substrate-opposed surface contacts the soft member so that the substrate-opposed surface is rubbed against the soft member. As such a soft member, a porous material capable of being impregnated with a cleaning solution may be used.

In the projection exposure apparatus of the present invention, it is preferable to employ, as the solution injector, an injector capable of emitting the cleaning solution applied with ultrasonic vibration.

On the other hand, an optical cleaning device for irradiating an irradiation light having an optically cleaning effect onto the surface of the optical member can be used.

The invention is further characterized in that the optical cleaning device comprises a gas supply means for supplying an oxidation-enhancing gas in the vicinity of the surface of the optical member. Therefore, the optical cleaning effect can be improved, since an oxidation-enhancing gas is supplied in the vicinity of the surface of the optical member during the cleaning operation by the cleaning device.

The invention is further characterized in that the optical cleaning device comprises a shield means for shielding the atmosphere including the optical path of the irradiation light in the vicinity of the surface of the optical member, against the external environment. Therefore, the cleaning effect can be increased by the action of the oxidation-enhancing gas, since the atmosphere in the vicinity of the surface of the optical member is shielded from the external environment by a shield means in such a way that includes the optical path of the irradiation light.

The invention is further characterized in that the optical cleaning device is one capable of irradiating an irradiation light onto the optical member through a replaceable window. Therefore, the optical cleaning device can be protected by the window, and the optical cleaning effect can be satisfactorily maintained by replacing the window with a new one if the window is contaminated.

The invention is further characterized in that the apparatus includes a contamination inspection device for inspecting the optical member for contamination. The invention is further characterized in that the cleaning device comprises a judging unit for determining whether or not cleaning of the optical member is necessary based on the inspection result obtained in the contamination inspection device.

The present invention is further directed to a projection exposure apparatus for transferring a pattern defined on a mask onto a substrate via a projection optical system, wherein there is provided a contamination inspection device for inspecting the optical member disposed in a given position for contamination. The contamination inspection device may be provided singly or in combination with the cleaning device.

When the contamination inspection device is provided in combination with the cleaning device, prior to the pattern transfer operation, the optical member may be inspected for contamination to determine whether or not the cleaning of the optical member is necessary. Based on the inspection result obtained in the contamination inspection device, it can be ensured that the cleaning operation for the optical member is performed at any time when it is required, and the cleaning effect can be confirm. Thus, the exposure accuracy can be improved.

When the contamination inspection device is provided singly, prior to the pattern transfer operation, the optical member may be inspected for contamination to determine whether or not the replacement of the optical member is necessary. Based on the inspection result obtained in the contamination inspection device, it can be ensured that the optical member is replaced with a new one at any time when it is required. Therefore, the exposure accuracy can be improved.

For the contamination inspection device, various types of constructions may be possible. For example, the contamination inspection device may comprise: an irradiation optical system for irradiating light to the optical member; a photodetector for detecting the light from the optical member; and a contamination inspection processing unit for inspecting the optical member for contamination based on the detection result from the photodetector.

As the inspection light for the inspection, an exposure illumination light may be available. In this case, it is required to chose an optical member capable of transmitting an UV light as the optical member of the inspection optical system. Such a requirement limits the range of choices for the optical member. Therefore, it is preferable that the contamination inspection device be adapted to irradiate the inspection light onto the surface facing the substrate of the optical member, and that the inspection light detect a spectrum of a reflection component reflected on the optical member.

The invention is further characterized in that an inspection means for determining the contamination level of the surface of the optical member disposed in the vicinity of the projection optical system of the projection exposure apparatus. Therefore, the contamination level of the surface of the optical member at the vicinity of the substrate in the projection optical system is determined by the inspection means. Based on the determined result, before the cleaning operation, the necessity of the cleaning operation can be determined, while after the cleaning operation, the contamination removal level by the cleaning operation can be known.

The invention is further characterized in that the inspection device measures a reflectance of a reflection light reflected on the surface of the optical member or a transmittance of a transmission light passed through the surface of the optical member, and then determines the contamination level of the surface of the optical member based on the measurement result. Therefore, the inspection for contamination can be performed by determining the reflectance or transmittance on the surface of the optical member to be inspected.

The invention is further characterized in that the inspection device determines the contamination level of the surface of the optical member based on the comparison result between a preset given reflectance of transmittance and an actually measured real reflectance or transmittance, respectively. The predetermined reflectance or transmittance may be defined as a reflectance or transmittance on the surface of the optical member which is determined when the contamination level of the surface of the optical member falls within a predetermined permissible range. Therefore, the contamination level can be determined in such a manner that a reflectance or transmittance on the surface of the optical member to be inspected is previously determined (which is defined as the predetermined reflectance $R_0$ or transmittance), and the contamination level is then determined based on the difference between an actually determined real reflectance $R_r$ or real transmittance and the predetermined reflectance $R_0$ or transmittance, respectively.

The invention is further characterized in that the inspection device measures a reflectance of a reflection light reflected on the surface of the optical member or a transmittance of a transmitted light passed through the surface of the optical member, and then determines a real reflectance $R_r$ or transmittance from the comparison result between a photoelectric signal for the irradiation light received after reflected on the surface of the optical member or after passed through the surface of the optical member and a photoelectric signal for the irradiation light received without the presence of the optical member. Therefore, for example, when the irradiation light is irradiated for several times at intervals during the cleaning operation, the variation with every cleaning operation in contamination removal level can be reflected as the real reflectance $R_r$ or transmittance.

The invention is further characterized in that both the above-mentioned contamination inspection device and the above-mentioned cleaning device for the optical member are provided. The invention is further characterized in that the cleaning device comprises an optical cleaning device for irradiating an irradiation light having an optical cleaning effect onto the surface of the optical member. Therefore, when it is determined that "the cleaning operation is necessary" based on the result obtained in the projection optical system inspection device, a given irradiation light is emitted from the optical cleaning device to remove the contamination on the surface of the optical member.

The present invention is also directed to a projection exposure apparatus for transferring a pattern defined on a mask onto a substrate via a projection optical system, the apparatus including a contamination protection device for making a gas flow between the optical member disposed in the vicinity of the exposure surface of the substrate and the substrate to prevent the approach of contaminants generated from the substrate toward the optical member.

According to the projection exposure apparatus of the present invention, the contamination protection device makes gas flow between the substrate and the optical member to prevent the approach of the contaminants released from the substrate toward the optical member. Therefore, the presence of any intermediate other than the gas is not needed between the optical member and the substrate on the traveling path of the exposure illumination light. Therefore, the contamination of the substrate-opposed surface of the optical member can be reduced and the exposure accuracy can be improved.

For the contamination inspection device, various constructions may be employed. For example, the contamination protection device may comprise: a flow-path setting member for setting the flow path of the gas in the vicinity of the substrate-opposed surface of the optical member; and a gas supply unit for supplying the gas to the flow path set by the flow-path setting member.

The above-described variations of the present invention may be applicable for various types of optical members. For example, the optical member may be one disposed on the optical path of the exposure illumination light in the vicinity of the substrate, or it may be one disposed at the end part of an optical system for alignment of the substrate.

As the optical system for alignment of the substrate, an alignment optical system for alignment of the substrate in the direction vertical to the optical axis of the projection optical system or a focus detection optical system for alignment of the substrate in the direction parallel to the optical axis of the projection optical system may be employed, for example.

According to the projection exposure apparatuses of the present invention, there is no need of apprehension of the contamination of the optical member which is arranged on the optical path of the exposure illumination light and in the vicinity of the substrate caused by the attachment of contaminants during pattern transfer. In addition, it becomes possible to design a projection exposure apparatus with a projection optical system disposed close to a substrate. Therefore, a projection exposure optical system with higher numerical aperture can be readily manufactured.

According to the projection exposure apparatuses of the present invention, the optical member arranged at the end part of an optical system for alignment of the substrate, which is likely to become adhered with a photosensitive agent or the like, is the target of the cleaning, the contamination inspection or the contamination protection. Therefore, the contamination of the optical member can be reduced and the exposure accuracy can be improved.

The present invention is further directed to a projection exposure method for transferring a pattern defined on a mask onto a substrate via a projection optical system, the method comprising: a cleaning step for removing the contamination on an optical member disposed at a given position; and a pattern transfer step for transferring a pattern defined on the mask onto the substrate via the projection optical system.

The present invention may be applicable for various types of optical members. For example, the optical member may be one disposed on the optical path of the exposure illumination light and in the vicinity of the substrate.

According to the projection exposure method noted above, prior to the pattern transfer step, the cleaning step is first performed to remove the contaminants (e.g., a photosensitive agent), as a result of the previous pattern transfers, attached on the optical member disposed near the exposure surface of the substrate, thereby making the optical member clean. Therefore, the pattern transfer can be satisfactorily performed under the condition where the contamination of the optical member is reduced and any intermediate other than the atmosphere is not present between the projection optical system and the substrate.

The cleaning operation may be performed every time the pattern transfer operation is performed. However, if the contamination of the optical member caused by one pattern transfer is small, it may also be possible to perform, prior to the cleaning step, a contamination evaluation step for determining the relation between the contamination level of the optical member and the number of pattern transfer operations and then determining the limit in number of pattern transfer operations, which is the number of exposure operations during which the clean substrate-opposed surface of the optical member is contaminated to a predetermined impermissible level; and the cleaning step is performed before the number of pattern transfer operations performed after the previous cleaning step exceeds the limit.

According to the projection exposure method of the present invention, the cleaning step can be performed at any time when the contamination level falls within a predetermined permissible range, for example, every time pattern transfer is performed for a predetermined number of times or at regular intervals. Therefore, the workability of the apparatus can be improved.

The invention is further directed to a projection exposure method for transferring a pattern defined on a mask onto a substrate via a projection optical system, the method comprising: a contamination inspection step for inspecting an optical member disposed at a predetermined position for contamination; and a judging step for determining whether or not pattern transfer will be performed based on the inspection result obtained in the inspection step.

According to the just described projection exposure method, prior to pattern transfer, the contamination inspection step is performed to inspect the optical member for contamination. In the judging step, based on the result obtained in the contamination inspection step, it is determined whether or not the contamination level of the optical member caused by the pattern transfer operations exceeds a predetermined permissible limit. When it is estimated that the contamination level of the optical member exceeds the predetermined permissible limit, the cleaning or replacement of the optical member is performed. When it is estimated that the contamination level of the optical member does not exceed the predetermined permissible limit, the pattern transfer is performed. In this manner, based on the result obtained in the contamination inspection step, it can be ensured that the optical member is cleaned or replaced with a new one at any time when it is required. Therefore, the exposure accuracy can be improved and the workability of the apparatus can also be improved.

The invention is further characterized in that, in the above-noted cleaning step, an irradiation light having an optical cleaning effect is irradiated onto the contamination on the optical member. The invention is further characterized in that a cleaning step for removing the contamination on the optical member based on the inspection result obtained in the inspection step is further included.

The invention is further directed to a method for assembling a projection exposure apparatus for transferring a pattern defined on a mask onto a substrate via a projection optical system, the method comprising: providing a cleaning device for cleaning an optical member disposed at a given position relative to the projection exposure apparatus. The invention is further characterized in that the cleaning device is an optical cleaning device for irradiating an irradiation light having an optical cleaning effect onto the contamination on the optical member. The invention is further characterized in that the projection exposure apparatus is further provided with a contamination inspection device for inspecting the optical member for contamination.

BEST MODE FOR CARRYING OUT THE INVENTION

Hereinbelow, the present invention will be described in detail with reference to the drawings.

[Embodiment 1]

The projection exposure apparatus and method according to the first embodiment of the present invention (Embodiment 1) will be illustrated below with reference to FIGS. 1–5.

In the projection exposure apparatus of the present embodiment, pattern transfer onto a wafer W is performed, while cleaning an optical member (which is adapted to be disposed in the vicinity of the wafer W during pattern transfer) at the time when pattern transfer is not performed. A schematic illustration of the apparatus is presented in FIG. 1. The apparatus employs the so-called "step-and-scan" type of exposure mode.

Figure 1:
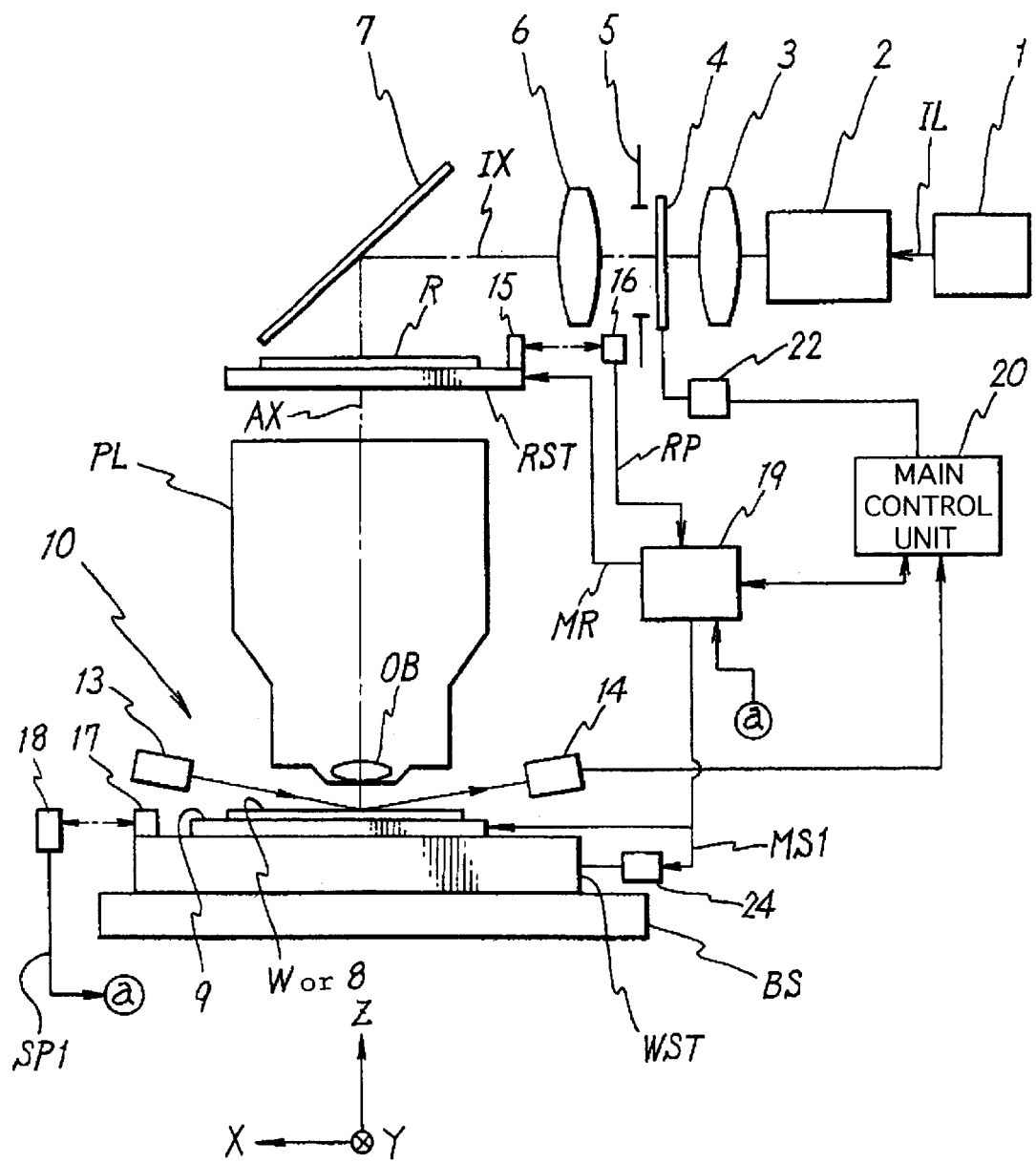
FIG. 1 is a schematic illustration of a projection exposure apparatus according to the first embodiment of the invention.

As shown in FIG. 1, the apparatus comprises an illumination system comprising a light source 1 and an illumination optical system (including 2,3 and 5–7); a reticle stage RST (i.e., a mask stage) for holding a reticle R (i.e., a mask); a projection optical system PL; a stage unit 10 which has a wafer stage WST for holding either a wafer W (i.e., a substrate) or a cleaning member 8 (as a cleaning device); a control system for controlling these components; and the like. On the wafer stage WST, the wafer W is held during pattern transfer, or the cleaning member 8 is held during cleaning.

The illumination system comprises a light source 1, an illuminance-uniformalizing optical system 2 comprising a collimator lens or a fly-eye lens or the like (not shown), relay lenses 3 and 6, a variable ND filter 4, a reticle blind 5, a dichroic mirror 7 and the like; in which the illuminance-uniformalizing optical system 2, the relay lenses 3 and 6, the reticle blind 5 and the dichroic mirror 7 constitute an illumination optical system.

The configuration of the illumination system and the functions of the components thereof are as follows. An illumination light IL generated by a light source 1 passes through a shutter (not shown), and then converted to a light flux with an approximately uniform illuminance distribution by an illuminance-uniformalizing optical system 2. Examples of the illumination light IL include an excimer laser beam (e.g., KrF excimer laser beam, ArF excimer laser beam), harmonics of a copper vapor laser or YAG laser, and an emission line in the UV zone from a vary high pressure mercury lamp (e.g., g-line, i-line).

The light flux ejected from the illuminance-uniformalizing optical system 2 in a horizontal direction reaches a reticle blind 5 through a relay lens 3. The reticle blind is arranged on a plane which is optically conjugated with both the image plane of a reticle R and the exposure plane of a wafer W. A variable ND filter 4 is arranged so as to closely contact with the side facing the relay lens 3 of the reticle blind 5.

The reticle blind 5 may be one which can control the dimension of its aperture (e.g., slit width) by closing or opening a plurality of movable light shield plates (e.g., two L-shaped movable light shield plates) by, for example, a motor. By controlling the dimension of the aperture, a slit-shaped illumination area IAR (see FIG. 2) for illuminating the reticle R can be adjusted to desired shape and dimension.

The variable ND filter 4 is designed to adjust the transmittance distribution to a desired one, and is consist of a ND filter of double-screen type, a liquid crystal display panel, an electrochromic device or an ND filter having any other desired structure. In the present embodiment, the variable ND filter 4 is controlled by a variable ND filter control member 22 with respect to loading, rotational angle or the like, so that the illuminance distribution within the illumination area IAR on the reticle R can be made non-uniform systematically and, consequently, the amount of light exposed onto the wafer W can be kept constant during scanning. Generally, the total transmission of the entire is 100%, and so the illuminance distribution within the illumination area IRA on the reticle R is uniform.

The light flux passed through the variable ND filter 4 and the reticle blind 5 reaches a dichroic mirror 7 through a relay lens 6, where the light flux is bend in the vertical direction to illuminate the illumination area IAR on the reticle R on which a circuit pattern or the like is drawn.

The reticle R is held on a reticle stage RST by means of, for example, vacuum suction. The reticle stage RST is micro-movable in two-dimensional directions (i.e., in the X axis direction, the Y axis direction orthogonal to the X axis direction, and the rotational direction about the Z axis perpendicular to the X-Y plane) on a plane perpendicular to the optical axis IX of the illumination optical system (which is consistent with the optical axis AX of the below-mentioned projection optical system PL), for alignment of the reticle R.

The reticle stage RST is movable at a predetermined scanning velocity in a specified direction (i.e., in a scanning direction) by a reticle drive member (not shown) comprising a linear motor or the like. The reticle stage RST has such a motion stroke that the entire surface of the reticle R can pass across at least the optical axis IX of the illumination optical system.

At the end part of the reticle stage RST, there is provided a movable mirror 15 which reflects the laser beam from a reticle laser interferometer (hereinafter, simply referred to as "reticle interferometer") 16. The position of the reticle stage RST on the stage-movable plane is detected continuously by the reticle interferometer 16 at a resolution of, for example, about 0.01 $\mu$m. In practical applications, on the reticle stage RST, there are usually provided two movable mirrors (i.e., one having a reflective surface orthogonal to the scanning direction and one having a reflective surface orthogonal to the non-scanning direction) and two corresponding reticle interferometers (i.e., one for detecting the position of the reticle stage RST in the scanning direction and one for detecting the position of the reticle stage RST in the non-scanning direction). In FIG. 1, these movable mirrors and reticle interferometers are represented by "a movable mirror 15" and "a reticle interferometer 16", respectively.

The positional information RP for the reticle stage RST output from the reticle interferometer 16 is supplied to a stage control system 19. The stage control system 19 outputs a reticle movement command MR to a reticle drive unit (not shown) based on the positional information for the reticle stage RST, and operates to drive the reticle stage RST via the reticle drive unit.

Since the initial position of the reticle stage RST is set so that the reticle R can be aligned with a predetermined base position by a reticle alignment system (not shown) with high accuracy, it is recognized that the position of the reticle R can be detected with satisfactorily high accuracy simply by detecting the position of the movable mirror 15 by the reticle interferometer 16.

The projection optical system PL may be of catadioptric type or dioptric type, and the optical device of the projection optical system PL may be made of quartz or fluorite or the combination thereof.

The projection optical system PL is disposed under the reticle stage RST in FIG. 1, where the direction of the optical axis AX thereof (which is consistent with the optical axis IX of the illumination optical system) is defined as the Z direction. The projection optical system PL is also provided with an objective lens OB as an optical member which is adapted to be positioned in the most vicinity of the wafer W during pattern transfer. The projection optical system PL of the present embodiment is a dioptric-type of both-side telecentric optical system having a specified reducing magnification (e.g., 1/5 or 1/4). Therefore, when the illumination area IAR on the reticle R is illuminated with the illumination light IL emitted from the illumination optical system, a reduced image of the circuit pattern on the reticle R is formed onto the wafer W with a coat of a photoresist (e.g., a photosensitive agent) via the projection optical system PL.

The stage unit 10 is disposed under the projection optical system PL in FIG. 1. It comprises a wafer stage WST which is almost square and movable in the X and Y directions two-dimensionally on a base BS, a wafer holder 9 mounted on the wafer stage WST, and a center-up 12 integrated into the wafer holder 9 as a vertically (i.e., up-and-down) movable member (see FIG. 3).

The wafer W is held on the wafer holder 9 by vacuum suction. The wafer holder 9 is tiltable to any angle relative to the best focus (image) plane of the projection optical system PL and is micro-movable in the direction of the optical axis AX (i.e., in the Z direction) of the projection optical system PL. The wafer holder 9 is also rotatable about the optical axis AX.

The wafer stage WST is movable in the scanning direction (i.e., the X direction), as well as in the direction perpendicular to the scanning direction (i.e., the Y direction) so that a plurality of shot areas on the wafer W can be positioned on the exposure field that is conjugated with the illumination area IAR. Therefore, the wafer stage WST effects the "step-and-scan"operation, in which an operation for scanningly exposing each shot area on the wafer W and an operation for transporting the shot area to the position where the exposure of the next shot area is started are repeated sequentially. The wafer stage WST can be driven in the X and Y directions two-dimensionally by a wafer stage drive unit 24 (e.g., a motor).

At the end part of the wafer stage WST, there is provided a movable mirror 17 which reflects a laser beam ejected from a wafer laser interferometer (hereinafter, simply referred to as "wafer interferometer") 18. The position of the wafer stage WST on the XY plane is continuously detected by the wafer interferometer 18 at a resolution of, for example, about 0.01 μm. In practical applications, on the wafer stage WST, there are usually provided two movable mirrors (i.e., an X movable mirror 17X having a reflective surface orthogonal to the scanning direction and a Y movable mirror 17Y having a reflective surface orthogonal to the non-scanning direction) and two corresponding wafer interferometers (i.e., an X wafer interferometer 18X for detecting the position of the wafer stage WST in the X direction and a Y wafer interferometer 18Y for detecting the position of the wafer stage WST in the Y direction). In FIG. 1, these movable mirrors and wafer interferometers are represented by "a movable mirror 17" and "a wafer interferometer 18", respectively. The positional (or velocity) information SP1 for the wafer stage WST is supplied to the stage control system 19. The stage control system 19 outputs a wafer drive command MS1 based on the information SP1 and operates to drive the wafer stage WST via the wafer stage drive unit 24.

In the present embodiment, the wafer holder 9 has a round shape. The wafer holder 9 has, on its top surface, concentric suction grooves (not shown) for holding the wafer W thereon by vacuum suction. The internal spaces of the grooves are evacuated with a vacuum pump (not shown) to hold the wafer W on the wafer holder 9 by the force of vacuum suction. For making the most effective use of the focal depth of the projection optical system PL, it is necessary that the wafer W be held with a good flatness and the possibility of lodging of dust particles between the wafer W and the wafer holder 9 be eliminated. Therefore, the wafer holder 9 is designed to hold the wafer W with the smallest possible contact area and prevent the buckling of the wafer W. It would be appreciated that the configuration of the suction grooves is not limited to a concentric one and other configuration may be employed such as dotty or linear configuration.

Figure 3:
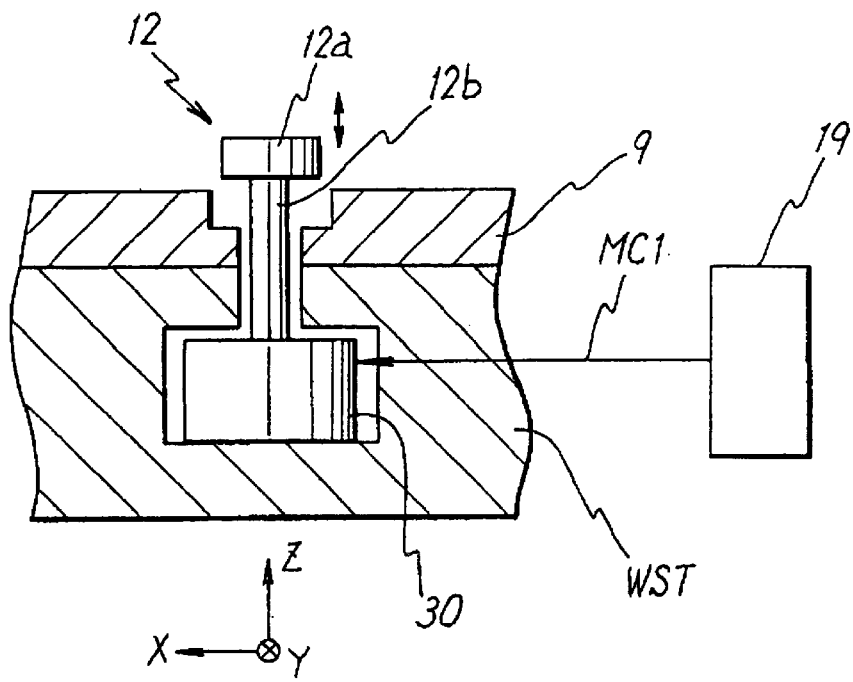
FIG. 3 is an illustration of a center-up in the apparatus shown in FIG. 1.

As shown in FIG. 3 in section, a center-up 12 comprises a sucking section 12a provided at the top position and a shaft 12b. The sucking section 12a is movable vertically (i.e., upward and downward) by a center-up driving mechanism (not shown) in a unit 30 in accordance with a center-up drive command MC1 output from the stage control system 19. The sucking section 12a has at its center a suction hole (not shown). The suction hole penetrates through the center part of the shaft 12b in the axis-wise direction, and connected with a suction tube which has been connected with a vacuum pump (not shown) in the vicinity of the bottom of the unit 30. In this manner, the wafer W is held on the top surface of the sucking section 12a by the force of vacuum suction caused by the vacuum pump. The vertical movement of the center-up 12 is monitored by a limit switch, a position sensor or the like (not shown).

Figure 2:
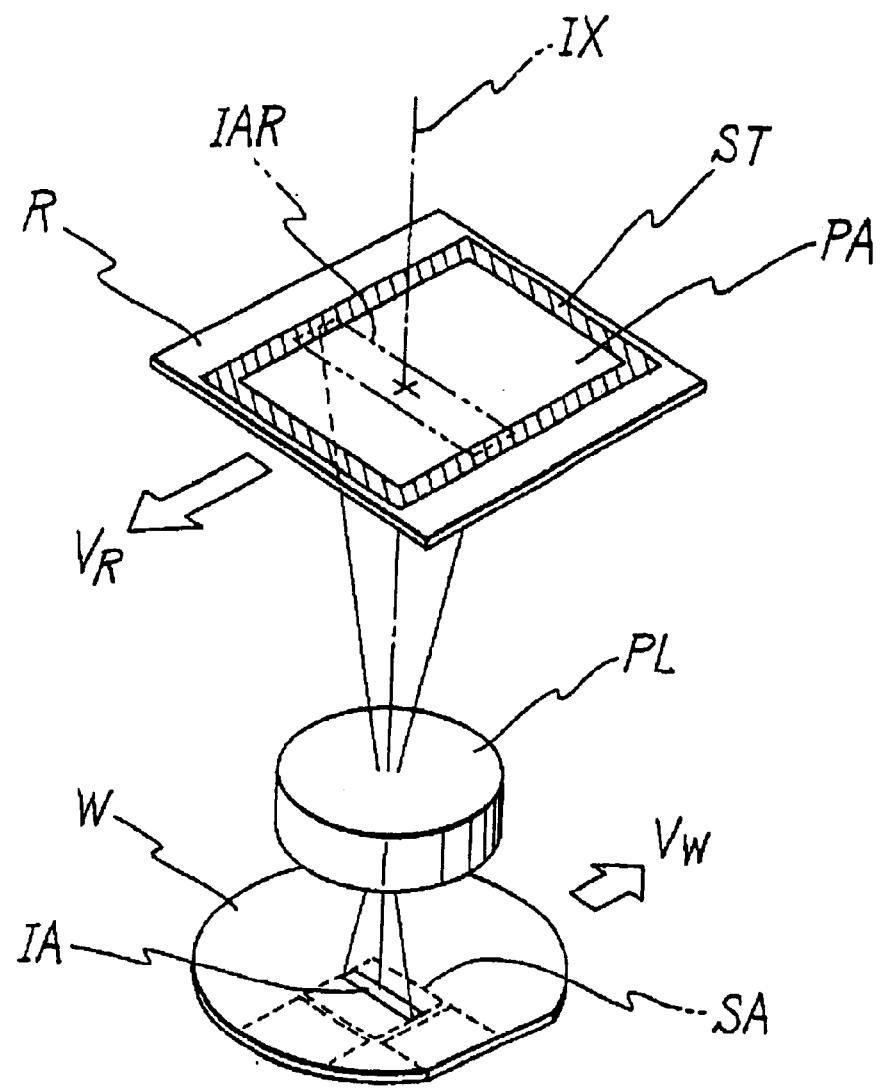
FIG. 2 is an illustration of assistance in explaining the principle of the scanning exposure of the apparatus shown in FIG. 1.

In the projection optical apparatus of the present embodiment, as shown in FIG. 2, the reticle R is illuminated at its rectangular (slit-shaped) illumination area IAR of which length-wise direction extends in the direction perpendicular to the scanning direction (i.e., the X direction) of the reticle R. For pattern transfer, the reticle R is scanned in the −X direction at a velocity VR. The illumination area IAR (of which center is approximately consistent with the optical axis AX) is projected on the wafer W through the projection optical system PL to define a slit-shaped exposure area IA. Since the wafer W and the reticle R has an inverted imaging relationship with each other, the wafer W is scanned at a velocity VW in the direction opposite to the direction of velocity VR (i.e., the +X direction) in synchrony with scanning of the reticle R. In this manner, the entire shot area SA on the wafer W can be exposed. The ratio between these scanning velocities (VW/VR) is in precise agreement with the reducing magnification of the projection optical system PL and, therefore, the pattern of the pattern area PA on the reticle R is transferred reducingly (i.e., transferred into a smaller image) onto the shot area SA on the wafer W with good accuracy. The length-wise width of the illumination area IAR is set wider than the pattern area PA on the reticle R and narrower than the maximum width of the shield area ST, so that the entire pattern area PA can be illuminated by scanning.

In FIG. 1 again, on the side of the projection optical system PL, there is provided an off-axis type of alignment microscope (not shown; explained below in detail) for detecting the position of the alignment mark (i.e., a wafer mark) provided on each shot area on the wafer W. The detection result from the alignment microscope is supplied to the main control unit 20 which totally controls the entire operation of the apparatus. The main control unit 20 computes the shot area array coordinate on the wafer based on the detected position of the wafer mark by means of, for example, statistical computation using the method of least squares as disclosed in Japanese Patent Application Laid-open No. 61-44429.

The alignment microscope is provided on one side of the projection optical system PL, and the present embodiment employs an image-processing type one with high magnifications. The alignment microscope comprises a light source which emits a broad-band illumination light (e.g., a halogen lamp), an objective lens, an index plate, an image pick-up element (e.g., a CCD), a signal processing circuit, a computation circuit and so on (all of these being not shown). The illumination light emitted from the light source goes through the objective lens in the alignment microscope and then irradiated on the surface of the wafer W. The light beam reflected on the wafer mark area (not shown) on the wafer surface travels backward into the alignment microscope, and goes through the objective lens and the index plate in this order, thereby forming images of the wafer mark and the index mark defined on the index plate on the image pick-up plane of, for example, a CCD. The photoelectically converted signals for these images are processed by the signal processing circuit, the positional relationship between the wafer mark and the index mark is computed by the computation circuit, and the computed result is supplied to the main control unit 20. Various methods have been proposed for alignment of the wafer W, and any method other than described above is applicable for this purpose.

In the apparatus shown in FIG. 1, an oblique incident type of wafer position detection system (i.e., a focal-point-position detection system) is provided to a support (not shown) which supports the projection optical system PL. The wafer position detection system comprises an irradiation optical system 13 which supplies an imaging light flux for forming a pinhole or slit image onto the best focus plane of the projection optical system PL from a direction inclined to the optical axis AX, and a light-receiving optical system 14 which receives the imaging light flux reflected on the surface of the wafer W through a slit. The structure and so on of the wafer position detection system are disclosed in, for example, Japanese Patent Application Laid-open No. 60-168112. The wafer position detection system is used to detect the positional deviation in the vertical direction relative to the image plane on the wafer (i.e., the Z direction) and move the wafer holder 9 in the Z direction so as to maintain a predetermined spacing between the wafer W and the projection optical system PL. The positional information for the wafer W output from the wafer position detection system is supplied to a stage control system 19 via the main control unit 20. The stage control system 19 operates to drive the wafer holder 9 in the Z direction based on the positional information for the wafer W.

In the present embodiment, the wafer position detection system is calibrated by presetting the angle of a plane-parallel glass plate (not shown) (which is disposed within the light-receiving optical system 14) so that the level on the image plane becomes a zero-point reference. For this purpose, a horizontal position detection system as disclosed in Japanese Patent Application Laid-open No. 58-113706 may also be employed. Alternatively, the wafer position detection system may be designed so that the focal position at any of a plurality of locations in the image field of the projection optical system PL can be detected (e.g., by forming a plurality of slit images on the image field), to thereby enable the detection of the angle relative to the image plane of a predetermined area on the wafer W.

Figure 4A:
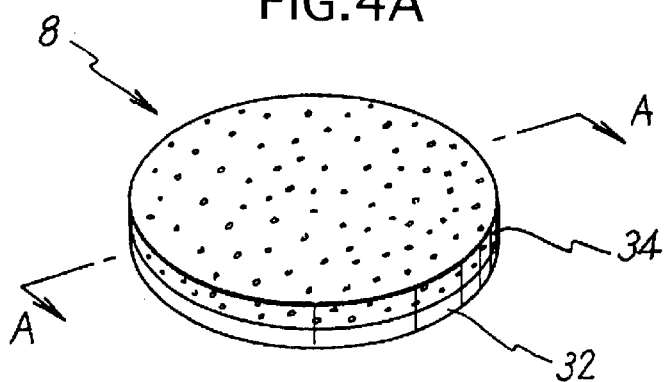
FIG. 4 is an illustration of a cleaning device in the apparatus shown in FIG. 1.
Figure 4B:
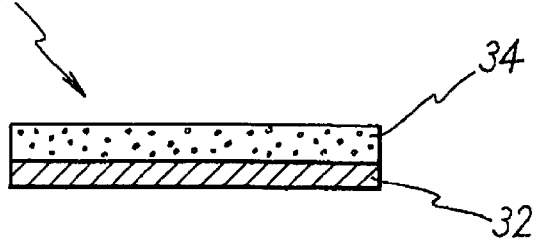

FIG. 4 illustrates the structure of a cleaning member 8, which is mounted on the wafer stage WST in place of the wafer W during cleaning. FIG. 4A is a perspective view of the cleaning member 8, and FIG. 4B is a cross-sectional view taken on line A–A in FIG. 4A. As shown in FIG. 4, the cleaning member 8 comprises a base section 32 comprising a hard material (e.g., a metal) and a soft section 34 adhesively held on the top surface of the base section 32. The soft section 34 comprises a material which has no fear of damaging the objective lens OB when contacting with it. Preferred materials for the soft section 34 include cloth-like, paper-like and sponge-like materials.

The cleaning member 8 is mounted on the sucking section 12a of the center-up 12 so as to contact with the sucking section 12a at the center part, and is held on the sucking section 12a by vacuum suction. The cleaning member 8 is movable in the vertical direction by the up-and-down movement of the center-up 12 in the vacuum-sucked state.

In the projection exposure apparatus of the present embodiment, pattern transfer is performed in the following manner.

Prior to pattern transfer onto the wafer W, cleaning is performed for the exposed surface opposed to the substrate (i.e., the wafer) (hereinafter, referred to as the "substrate-opposed surface") of the objective lens OB of the projection optical system PL. FIG. 5 illustrates the cleaning operation for the objective lens OB according to the present embodiment. In FIG. 5, for the purpose of explaining the operation more specifically, the cleaning member 8 and the components arranged near the objective lens OB are shown in section.

For cleaning, in place of the wafer W, the cleaning member 8 is mounted on the center-up 12 so that the sucking section 12a of the center-up 12 is located approximately at the center of the bottom surface of the cleaning member 8. The cleaning member 8 is held on the sucking section 12a by vacuum suction.

The mounting of the cleaning member 8 onto the center-up 12 may be performed by an operator manually on the wafer stage WST which has been moved away from beneath the projection optical system PL, or alternatively by transferring the cleaning member 8 by a wafer transfer device (not shown) in place of the wafer W and then operating the cleaning member 8 in the same manner as for the wafer W.

Next, in accordance with a command from the main control unit 20, the stage control system 19 outputs a wafer stage drive command MS1 based on the positional (or velocity) information SP1 for the wafer stage WST, while checking the position of the wafer stage WST, to move the wafer stage WST in the X and Y directions via the wafer stage drive unit 24, thereby transferring the cleaning member 8 to a position beneath the projection optical system PL. Subsequently, the stage control system 19 outputs a center-up drive command MC1 to elevate the sucking section 12a, so that the soft section 34 of the cleaning member 8 comes to contact with the exposed substrate-opposed surface of the objective lens (see FIG. 5A).

Figure 5A:
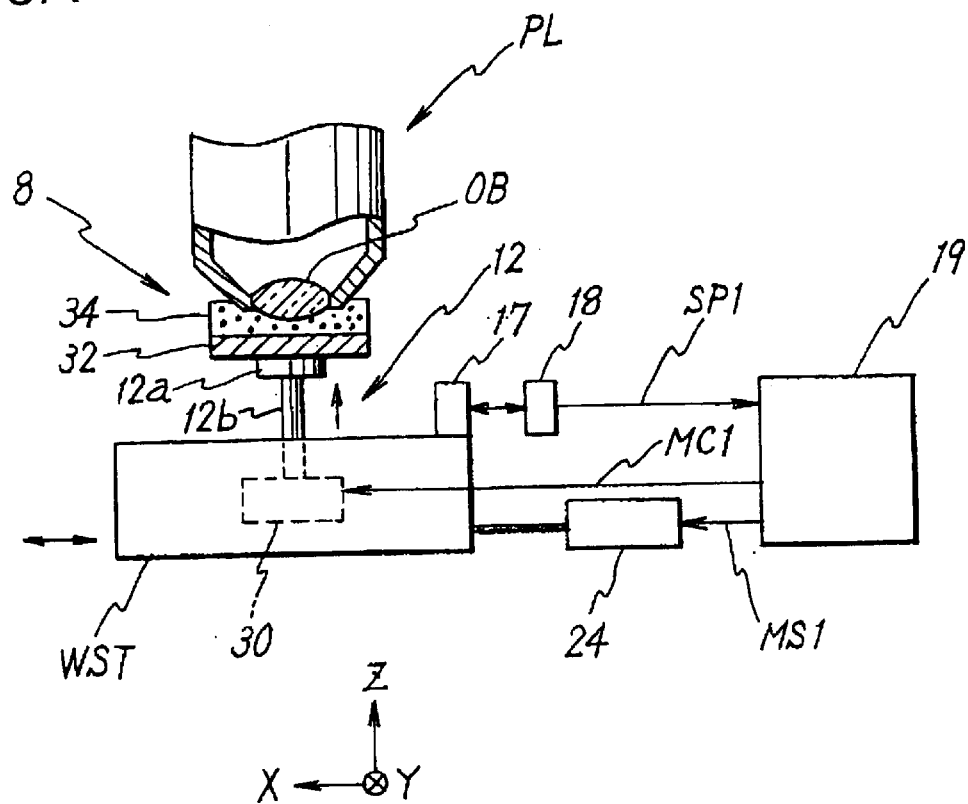
FIG. 5 is an illustration of assistance in explaining the cleaning process by the apparatus shown in FIG. 1.
Figure 5B:
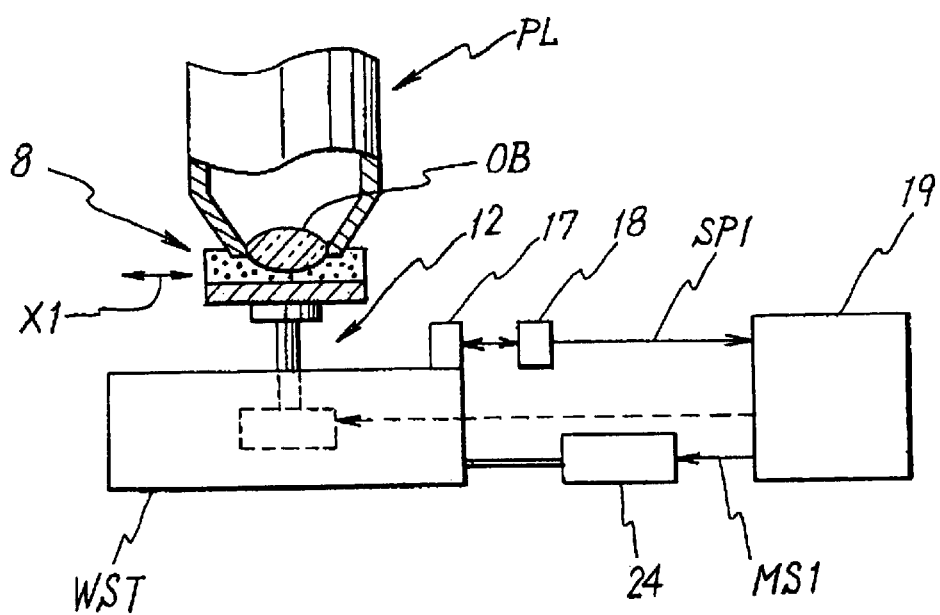

In accordance with a command from the main control unit 20, the stage control system 19 outputs a wafer stage drive command MS1 based on the positional (or velocity) information SP1 for the wafer stage WST, while checking the position of the wafer stage WST, to reciprocatively move the wafer stage WST at least in either of the X and Y directions via the wafer stage drive unit 24, thereby rubbing the soft section 34 against the substrate-opposed surface of the objective lens (see FIG. 5B). In this manner, the contamination on the substrate-opposed surface of the objective OB can be removed. In FIG. 5B, only an X-directional reciprocating movement of the wafer stage WST is representatively shown by arrow X1.

In accordance with a command from the main control unit 20, the stage control system 19 outputs a center-up drive command MC1 to move the sucking section 12a downward, thereby separating the soft section 34 of the cleaning member 8 from the objective lens. Subsequently, the vacuum suction applied to the sucking section 12a of the center-up 12 of the cleaning member 8 is released to remove the cleaning member 8 from the wafer stage WST.

The removal of the cleaning member 8 from the wafer stage WST may be performed by an operator manually after moving the wafer stage WST away from beneath the projection optical system PL, or alternatively by using a wafer stage transfer device in the same manner as for the wafer W.

After the cleaning operation is completed, pattern transfer onto the wafer W is performed in the following manner.

The wafer W transferred by the wafer transfer device is mounted on the wafer stage WST and then held on the wafer holder 9 by vacuum suction. The positions of the wafer W and the reticle R relative to the projection optical system PL are set with high precision by means of the alignment microscope or the stage control system 19. An exposure illuminant light generated in the illumination system (1, 2, 3 and 4–7) illuminates the reticle R, a pattern defined on the reticle R is projected onto the wafer W by the projection optical system PL, and the wafer is exposed to the light. In this manner, pattern transfer is accomplished.

According to the present embodiment, prior to pattern transfer, cleaning of the substrate-opposed surface of the optical member (i.e., the objective lens OB) of the projection optical system PL, which is disposed in the most vicinity to the exposure surface of the wafer W, is performed, thereby removing the contamination (e.g., a photosensitive agent) deposited on the substrate-opposed surface as a result of the previous pattern transfer. Consequently, satisfactory pattern transfer can be achieved under the conditions where the contamination of the substrate-opposed surface of the optical member is reduced and the projection optical system PL is brought closer to the wafer W without the presence of any intermediate other than the atmosphere.

The cleaning may be performed every time pattern transfer is performed. However, if the contamination of the optical member caused by one pattern transfer is very small, then the cleaning may be performed at any time during the contamination level falls within a predetermined permissible range, for example, every time pattern transfer is performed for predetermined times, or at regular intervals.

For this purpose, it is necessary to analyze the relationship between the contamination level and the number of pattern transfer operations, and determine the limit on the number of pattern transfer operations (i.e., the number of exposure operations) until a clean substrate-opposed surface of an optical member is contaminated to a predetermined impermissible level. In such determination, the transmittance through a reticle is also involved. Therefore, it may be possible to measure the optical energy of a light passing through the projection optical system PL by a sensor provided on the substrate stage WST and incorporate the measurement result into such determination. Once the limit on the number of transfer operations is determined, then cleaning is performed before the number of pattern transfer operations performed after the previous cleaning operation excesses the limit. Since the cleaning operation is performed at any time during the contamination level falls within a predetermined permissible range, for example, every time pattern transfer is performed for predetermined times, every time a light with a given optical energy is irradiated, or at regular intervals, it can be avoided to frequently halt the projection exposure apparatus for cleaning and, therefore, the workability of the apparatus can be improved.

In the present embodiment, the contamination is removed mechanically by rubbing the soft section 34 of the cleaning member 8 and the objective lens OB against each other. However, it may also be possible to use a porous (foam) material as the soft section 34, and to rub the objective lens OB against the porous soft section 34 impregnated with a cleaning solution comprising, for example, a solvent for a photosensitive agent. The cleaning solution should cause no damage to the objective lens OB itself or a coat thereof. In this case, the cleaning efficiency is increased since the cleaning solution can dissolve the contaminants. By using a cleaning solution, a satisfactory cleaning effect may be provided simply by contacting the soft section 34 with the objective lens OB, and the necessity of rubbing the objective member OB against the soft section 34 may be eliminated. The cleaning member 8 may also be of wiper-type or brush-type.

In the present embodiment, it may be possible to provide a rotary-movement drive unit which rotates the sucking section 12a of the center-up 12 on the X-Y plane. In this case, since the cleaning member 8 is rotated by the rotary movement of the sucking section 12, the soft section 34 is rubbed rotationally against the substrate-opposed surface of the objective lens OB.

[Embodiment 2]

Hereinbelow, the projection exposure apparatus and method according to the second embodiment of the present invention (Embodiment 2) will be illustrated with reference to FIGS. 6 and 7. In the following description, the components similar to those described in Embodiment 1 above are denoted by the same reference numerals, and the overlapping explanatory descriptions are omitted.

The projection exposure apparatus of the present embodiment is characterized in that, as a cleaning device, in place of the cleaning member 8 disposed on the wafer stage WST in the projection exposure apparatus of Embodiment 1, an ultrasonic cleaning device 40 (schematically shown in FIG. 6) is disposed on a cleaning stage CST distinct from the wafer stage WST. The objective lens OB of the projection optical system PL is cleaned by the ultrasonic cleaning device 40 at the time when pattern transfer is not preformed.

Figure 6:
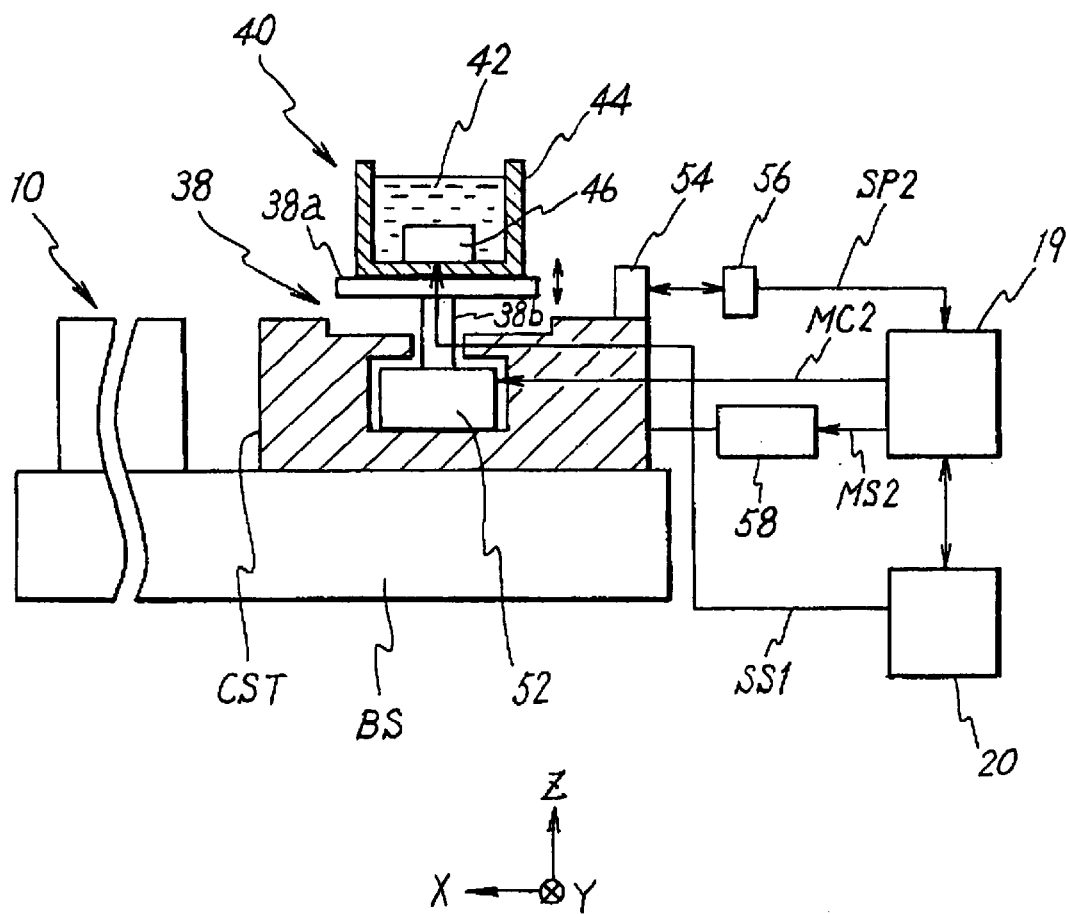
FIG. 6 is an illustration of a cleaning device in a projection exposure apparatus according to the second embodiment of the invention.
Figure 7A:
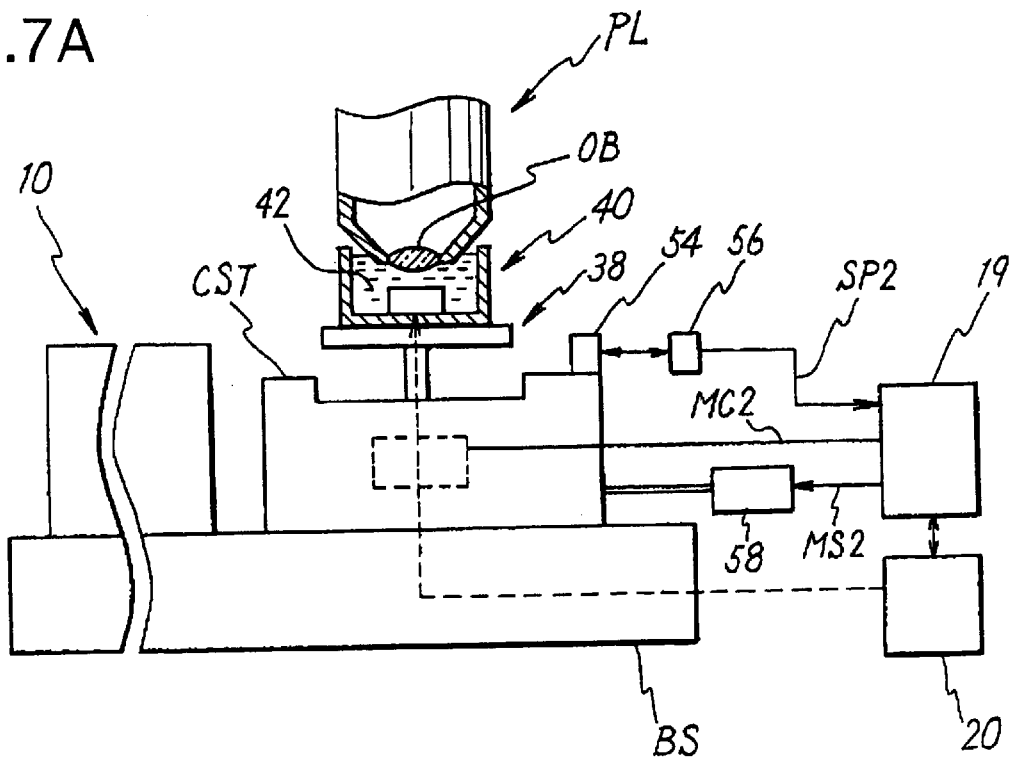
FIG. 7 is an illustration of assistance in explaining the cleaning process by a projection exposure apparatus according to the second embodiment of the invention.
Figure 7B:
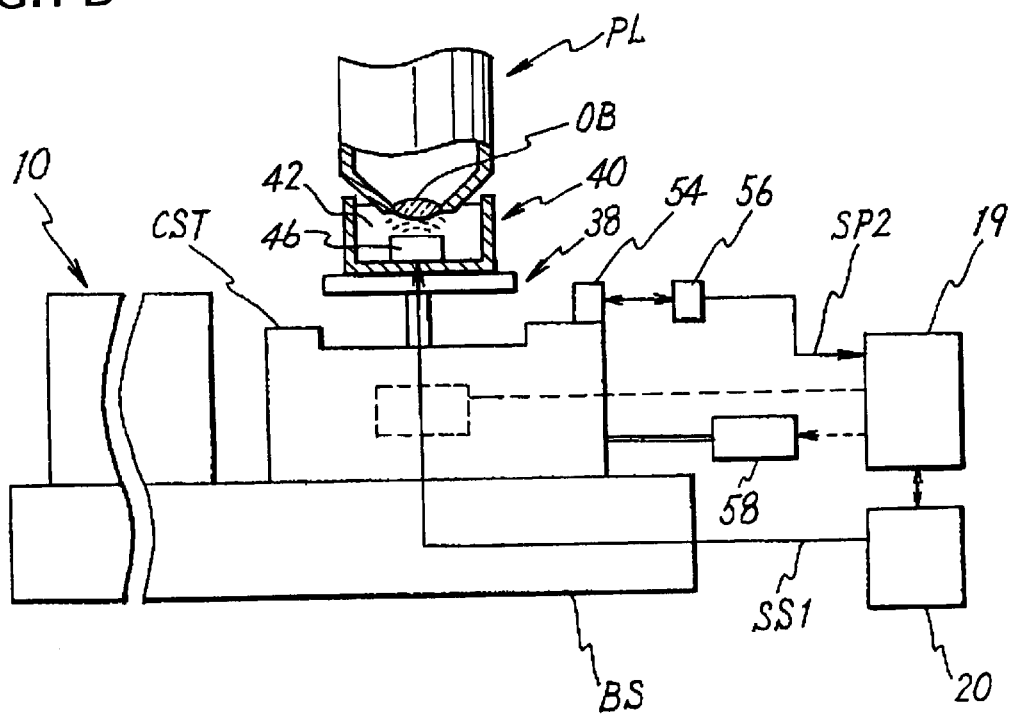

As shown in FIG. 6, the ultrasonic cleaning device 40 is provided on the base BS together with the stage unit 10, and is mounted on a approximately square cleaning stage CST which is movable in the X and Y directions two-dimensionally on the base BS. Into the cleaning stage CST is integrated an elevating device 38 as a vertical (up-and-down) movement mechanism.

The cleaning stage CST has the similar constitution as the wafer stage WST, and is movable in the X and Y directions two-dimensionally by a cleaning stage drive unit 58 (e.g., a motor).

At the end part of the cleaning stage CST, like the wafer stage WST, there is provided a movable mirror 54 which reflects the laser beam ejected from a cleaning device laser interferometer (hereinafter, simply referred to as a "cleaning device interferometer") 56. The position of the cleaning stage CST on the XY plane is continuously detected by the cleaning device interferometer 56. In practical applications, on the cleaning stage CST, there are usually provided two movable mirrors (i.e., an X movable mirror having a reflective surface orthogonal to the X direction, and a Y movable mirror having a reflective surface orthogonal to the Y direction) and two corresponding cleaning device interferometers (i.e., an X cleaning device interferometer for detecting the position in the X direction, and a Y cleaning device interferometer for detecting the position in the Y direction). In FIG. 6, these movable mirrors and cleaning device interferometers are represented by "a movable mirror 54" and "a cleaning device interferometer 56", respectively. A positional (or velocity) information SP2 for the cleaning stage CST is supplied to the stage control system 19. The stage control system 19 outputs a cleaning stage drive command MS2 based on the information, while checking the position of the cleaning stage CST, to control the cleaning stage CST via the cleaning stage drive unit 58.

The elevating device 38 has the similar structure to the above-mentioned center-up 12; namely, it comprises a sucking section 38a provided at the top position and a shaft 8b. The sucking section 38a is adapted to be vertically (up-and-down) movable by an elevating-device drive mechanism (not shown) in a unit 52 in accordance with an elevating-device drive demand MC2 output from the stage control system 19. Like the center-up 12, the sucking section 38a is designed to hold the ultrasonic cleaning device 40 by the force of vacuum suction by a vacuum pump (not shown). The vertical movement of the elevating device 38 is monitored by a limit switch, a positional sensor or the like (not shown).

As shown in FIG. 6, the ultrasonic cleaning device 40 comprises a vessel 44 which contains a cleaning solution 42, and a ultrasonic vibrator 46 which is provided in the vessel 44, and causes ultrasonic vibration in accordance with an ultrasonic vibration command SS1 output from the main control unit 20 to apply ultrasonic vibration to the cleaning solution 42. As the cleaning solution, water with high purity, acetone or a solution comprising a solvent for a photosensitive agent may be preferably used, provided that it causes no damage to the objective lens OB or a coat thereof.

In the present embodiment, an ultrasonic cleaning device 40 is exemplary used for the explanation. However, depending on the nature of the contamination of the objective lens OB, cleaning of the objective lens OB may be achieved simply by immersing it in the cleaning solution 42 in the vessel 44 without application of ultrasonic vibration by the ultrasonic vibrator 46. In order to remove the contamination of the objective lens OB more effectively, the objective lens OB may be coated with a super-hydrophilic (completely non-water-repellent) photocatalyst. When such a photocatalyst is used as a thin film of a certain composition, the contact angle formed by the surface of the thin film and the surface of water is decreased by irradiating the thin film with light (e.g., a UV ray), thereby providing a super-hydrophilic surface completely non-repellent to water. The coating of the objective lens OB with such a photocatalyst enables to remove the contamination thereon simply by immersing it in the cleaning solution 42.

In the projection exposure apparatus of the present embodiment, pattern transfer is performed in the following manner.

Prior to pattern transfer onto the wafer W, cleaning of the exposed substrate-opposed surface of the objective lens OB of the projection optical system PL is performed. FIG. 7 illustrates the cleaning operation for the objective lens OB according to the present embodiment. In FIG. 7, as in the case of FIG. 5, for the purpose of explaining the cleaning operation more specifically, the ultrasonic cleaning device 40 and the components arranged near the objective lens OB are shown in section.

For cleaning, in accordance with a command from the main control unit 20, the stage control system 19 operates to move the wafer stage WST away from a position beneath the projection optical system PL via the wafer stage drive unit 24. Subsequently, the stage control system 19 outputs a cleaning stage drive command MS2 based on a positional (or velocity) information SP2 for the cleaning stage CST, while checking the position of the cleaning stage CST, to move the cleaning stage CST in the X and Y directions via the cleaning stage drive unit 58. In this way, the ultrasonic cleaning device 40 is transferred to a position beneath the projection optical system PL. The stage control system 19 then outputs an elevating-device drive command MC2 to elevate the elevating device 38 so that the exposed substrate-opposed surface of the objective lens OB is immersed in the cleaning solution 42 (see FIG. 7A).

The main control unit 20 outputs an ultrasonic vibration command SS1 to generate ultrasonic vibration by the ultrasonic vibrator 46. The ultrasonic vibration is applied to the cleaning solution 42, and the substrate-opposed surface of the objective lens OB is cleaned with the ultrasonically vibrated cleaning solution (see FIG. 7B).

After the main control unit 20 operates to stop the ultrasonic vibration by the ultrasonic vibrator 46, the stage control system 19 outputs a vertical movement drive command MC2 to move the elevating device 38 downward, thereby separating the ultrasonic cleaning device 40 from the projection optical system PL.

After the cleaning operation is completed, the stage control system 19 operates to move the cleaning stage CST away from a position beneath the projection optical system PL via a cleaning stage drive unit 58. As in the case of Embodiment 1, pattern transfer is then performed as follows: the wafer W is held on the wafer holder 9 and aligned, the reticle R is illuminated with an exposure illumination light from the illumination system, a pattern defined on the reticle R is projected on the wafer W by the projection optical system PL, and the wafer W is then exposed to the light.

According to the present embodiment, as in the case of Embodiment 1, prior to pattern transfer, cleaning of the substrate-opposed surface of the optical member (i.e., the objective lens OB) of the projection optical system PL, which is disposed in the most vicinity to the exposure surface of the wafer W, is performed, thereby removing the contamination (e.g., a photosensitive agent) deposited on the substrate-opposed surface as a result of the previous pattern transfer. Consequently, satisfactory pattern transfer can be achieved under the conditions where the contamination of the substrate-opposed surface of the optical member is reduced and the projection optical system PL is brought closer to the wafer W without the presence of any intermediate other than the atmosphere.

Additionally, according to the present embodiment, since the cleaning operation and the operation for the wafer W are performed by separate drive units, the accuracy and cleanliness of the wafer stage WST are insured, and therefore cleaning and light exposure can be performed satisfactory.

As also in the case of Embodiment 1, it may be possible to analyze the relationship between the contamination level, the number of pattern transfer operations and the optical energy amount of the light irradiated onto the wafer W, and determine the limit on the number of pattern transfer operations (i.e., the number of exposure operations) until a clean substrate-opposed surface of an optical member is contaminated to a predetermined impermissible level. Based on the determined limit, the cleaning operation may be performed at any time during the contamination level does not exceeds the limit, for example, every time pattern transfer is performed for predetermined times, every time a light with a given optical energy is irradiated, or at regular intervals. As a result, it can be avoided to frequently halt the projection exposure apparatus for cleaning and, therefore, the workability of the apparatus can be improved.

[Embodiment 3]

Hereinbelow, the projection exposure apparatus and method according to the third embodiment of the present invention (Embodiment 3) will be illustrated with reference to FIGS. 8 and 9. In the following description, the components similar to those described in the above embodiments are denoted by the same reference numerals, and the overlapping explanatory descriptions are omitted.

Figure 8:
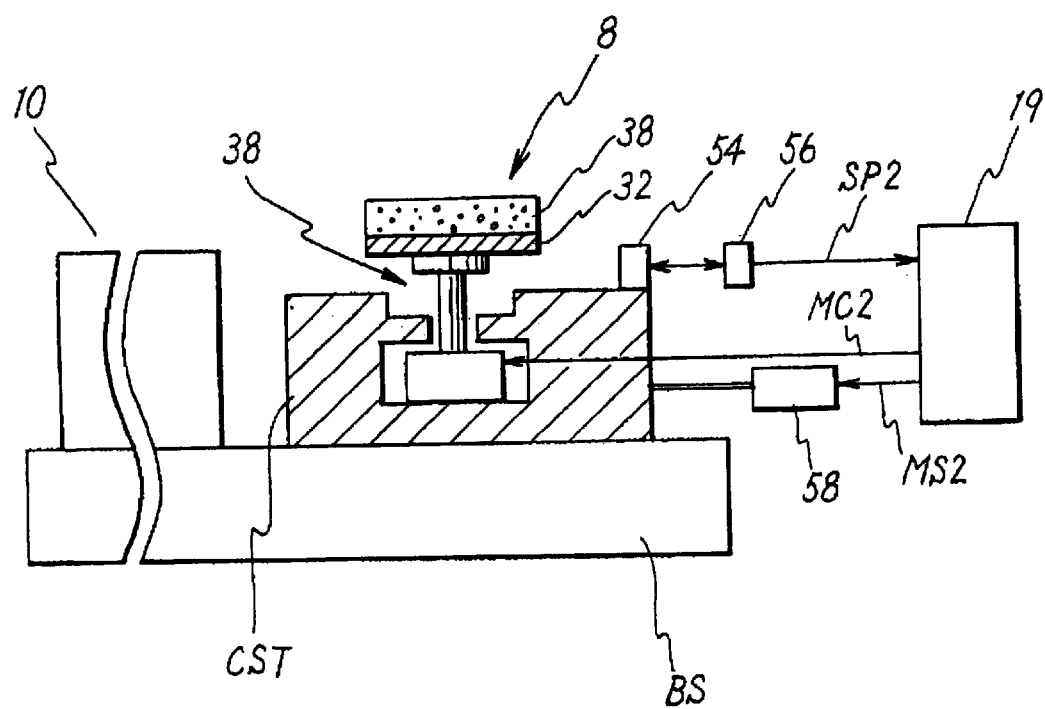
FIG. 8 is an illustration of a cleaning device in a projection exposure apparatus according to the third embodiment of the invention.
Figure 9A:
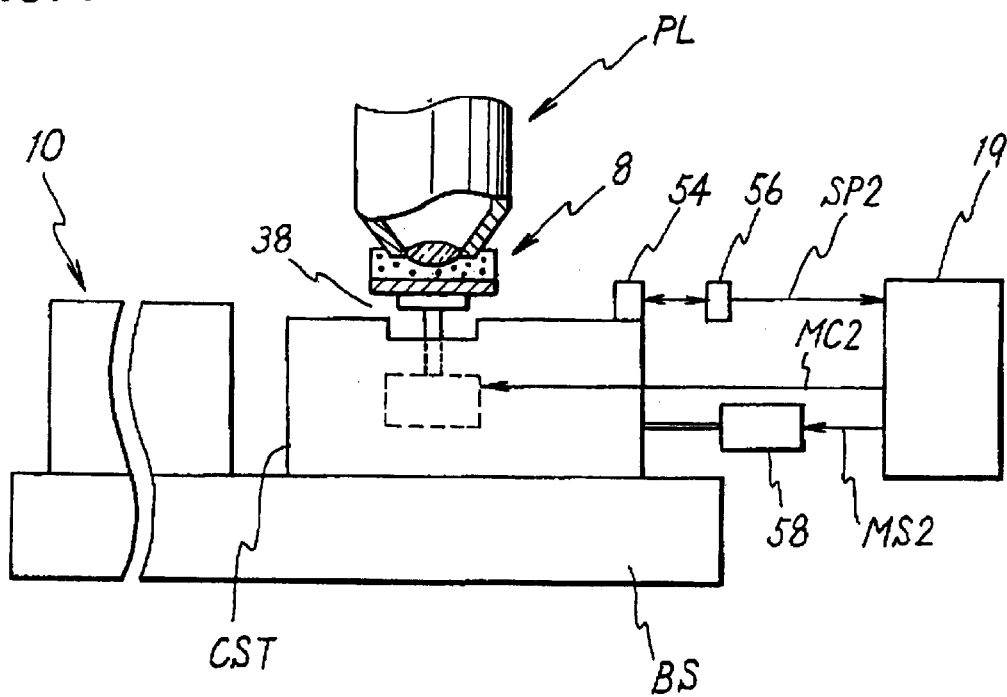
FIG. 9 is an illustration of assistance in explaining the cleaning process by a projection exposure apparatus according to the third embodiment of the invention.

The projection exposure apparatus of the present embodiment is characterized in that, the cleaning member 8 in the projection exposure apparatus of Embodiment 1 shown in FIG. 1 is disposed on the cleaning stage CST which is distinct from the wafer stage WST as shown in FIG. 8. The objective lens OB of the projection optical system PL is cleaned using the cleaning member 8 at the time when pattern transfer is not preformed. In other words, in the present embodiment, the ultrasonic cleaning device 40 in Embodiment 2 is replaced with the cleaning member 8 of Embodiment 1.

As in the case of Embodiment 2, the stage control system 19 outputs a cleaning stage drive command MS2 based on a positional (or velocity) information SP2, while checking the position of the cleaning stage CST, to control the cleaning stage CST via the cleaning stage drive unit 58.

In the projection exposure apparatus of the present embodiment, pattern transfer is performed in the following manner.

Prior to pattern transfer onto the wafer W, cleaning is performed for the exposed substrate-opposed surface of the objective lens OB of the projection optical system PL. FIG. 9 illustrates the cleaning operation for the objective lens OB according to the present embodiment. In FIG. 9, as in the case of FIG. 5, for the purpose of explaining the cleaning operation more specifically, the cleaning member 8 and the components arranged near the objective lens OB are shown in section.

For cleaning, as in the case of Embodiment 2, in accordance with a command from the main control unit 20, the stage control system 19 operates to move the wafer stage WST away from a position beneath the projection optical system PL via the wafer stage drive unit 24, and then operates to move the cleaning stage CST in the X and Y directions via the cleaning stage drive unit 58. In this way, the cleaning device 60 is placed under the projection optical system PL. Subsequently, the stage control system 19 outputs an elevating-device drive command MC2 to move the elevating device 38 upward, so that the soft section 34 of the cleaning member 8 comes to contact with the exposed substrate-opposed surface of the objective lens OB (see FIG. 9A).

Figure 9B:
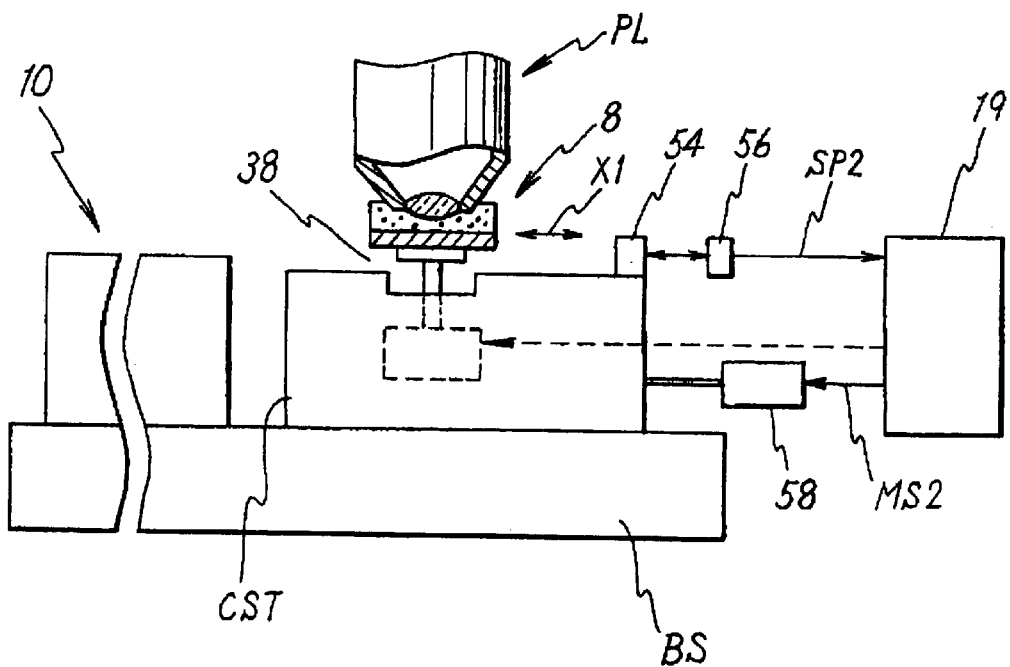

In accordance with a command from the main control unit 20, the stage control system 19 outputs a cleaning stage drive command MS2 based on the positional (or velocity) information SP2 for the cleaning stage CST, while checking the position of cleaning stage CST, to reciprocatively move the cleaning stage CST at least in either of the X and Y directions via the cleaning stage drive unit 58, thereby rubbing the soft section 34 against the substrate-opposed surface of the objective lens OB (see FIG. 9B). In this manner, the contamination on the substrate-opposed surface of the objective OB can be cleaned. In FIG. 9B, as in the case of FIG. 5B, only an X-directional reciprocating movement of the wafer stage WST is representatively shown by arrow X1.

In accordance with a command from the main control unit 20, the stage control system 19 outputs a vertical-movement drive command MC2 to move the elevating device 38 downward, so that the ultrasonic cleaning device 40 is separated from the projection optical system PL.

After the cleaning operation is completed, as in the case of Embodiment 1, pattern transfer is then performed as follows: the wafer W is held on the wafer holder 9 and aligned, the reticle R is illuminated with an exposure illumination light from the illumination system, a pattern defined on the reticle R is projected on the wafer W by the projection optical system PL, and the wafer W is then exposed to the light.

According to the present embodiment, as in the case of Embodiment 1, prior to pattern transfer, cleaning of the substrate-opposed surface of the optical member (i.e., the objective lens OB) of the projection optical system PL, which is disposed in the most vicinity to the exposure surface of the wafer W, is performed, thereby removing the contamination (e.g., a photosensitive agent) deposited on the substrate-opposed surface as a result of the previous pattern transfer. Consequently, satisfactory pattern transfer can be achieved under the conditions where the contamination of the substrate-opposed surface of the optical member is reduced and the projection optical system PL is brought closer to the wafer W without the presence of any intermediate other than the atmosphere.

As also in the case of Embodiment 1, it may be possible to analyze the relationship between the contamination level, the number of pattern transfer operations and the optical energy amount of the light irradiated onto the wafer W, and determine the limit on the number of pattern transfer operations (i.e., the number of exposure operations) until a clean substrate-opposed surface of an optical member is contaminated to a predetermined impermissible level. Based on the determined limit, the cleaning operation may be performed at any time during the contamination level does not exceeds the limit, for example, every time pattern transfer is performed for predetermined times, every time a light with a given optical energy is irradiated, or at regular intervals. As a result, it can be avoided to frequently halt the projection exposure apparatus for cleaning and, therefore, the workability of the apparatus can be improved. In the present embodiment, the cleaning member 8 may be modified in the same manner as mentioned in Embodiment 1.

[Embodiment 4]

Hereinbelow, the projection exposure apparatus and method according to the fourth embodiment of the present invention (Embodiment 4) will be illustrated with reference to FIGS. 10 and 11. In the following description, the components similar to those described in the above-described embodiments are denoted by the same reference numerals, and the overlapping explanatory descriptions are omitted.

Figure 10:
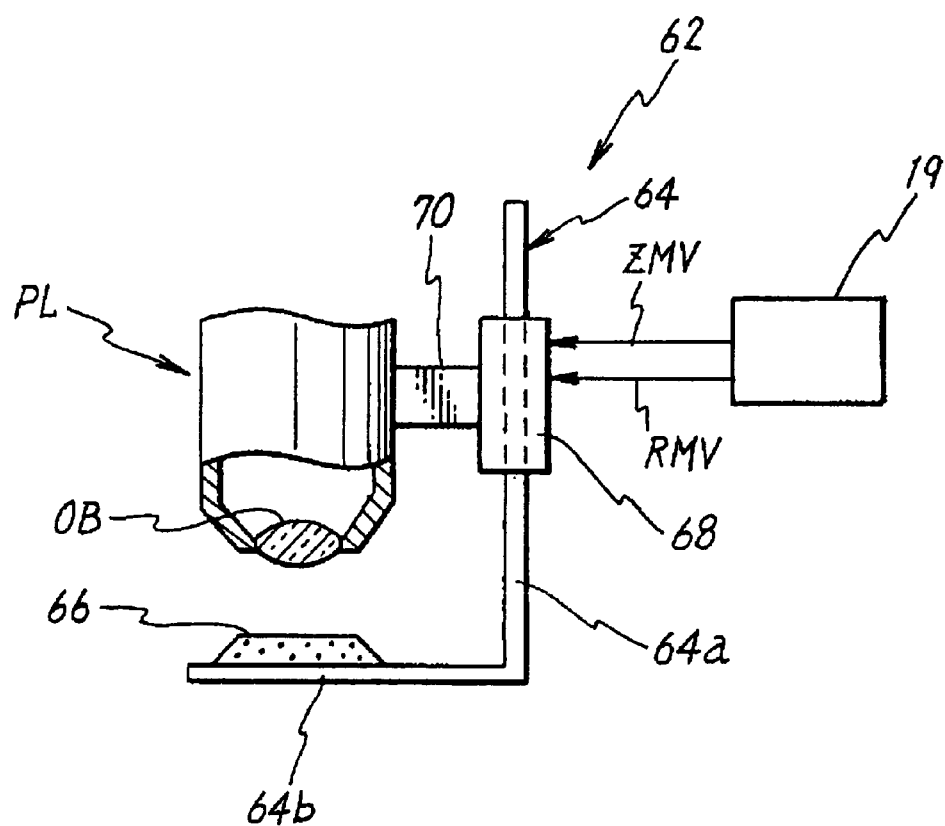
FIG. 10 is an illustration of a cleaning device in a projection exposure apparatus according to the fourth embodiment of the invention.
Figure 11A:
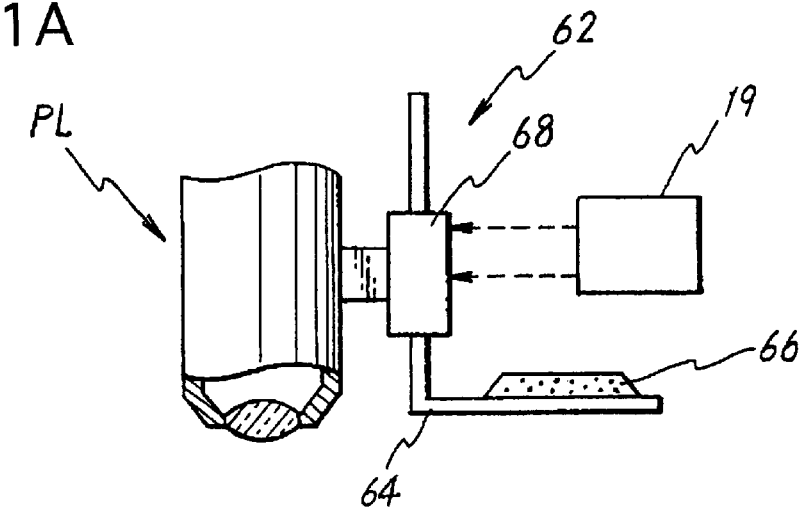
FIG. 11 is an illustration of assistance in explaining the cleaning process by a projection exposure apparatus according to the fourth embodiment of the invention.
Figure 11B:
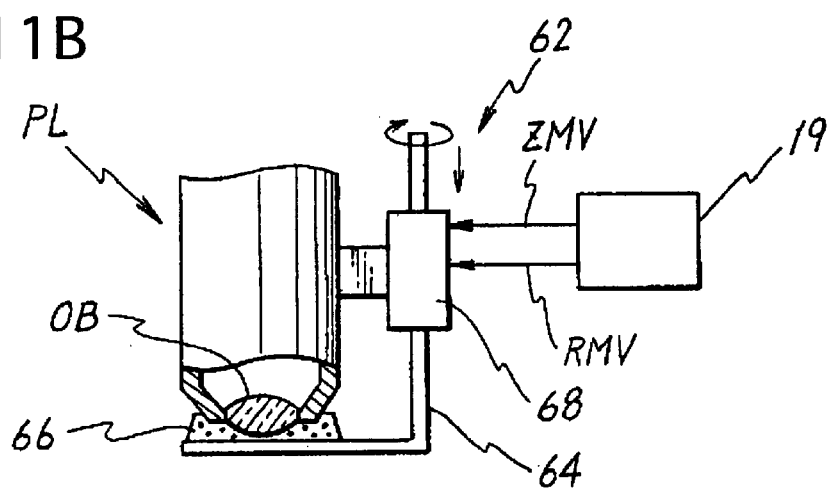

The projection exposure apparatus of the present embodiment is characterized in that the cleaning member 8 in the projection exposure apparatus of Embodiment 1 shown in FIG. 1 is replaced with a cleaning device 62 shown in FIG. 10 schematically in section. The objective lens OB of the projection optical system PL is cleaned using the cleaning device 62 at the time when pattern transfer is not preformed.

As shown in FIG. 10, the cleaning device 62 comprises a drive unit 68 which is connected to the projection optical system PL via a support member 70 extending in the horizontal direction, a L-shaped hold member 64 consisting of two sections 64a and 64b, and a soft member 66 which is held on the section 64b of the hold member 64. The section 64a (i.e., the vertical part of the hold member 64) is vertically supported at its a part by the drive unit 68 in a freely swingable manner. The soft member 66 together with the section 64b is movable swingly about of the section 64a (i.e., the swing axis) on a horizontal plane orthogonal to the page of FIG. 10 and is also movable in the vertical direction (i.e., the z direction parallel to the page of FIG. 10) by a drive mechanism (not shown; e.g., a motor) integrated in the drive unit 68.

The swing movement and the vertical movement of the hold member 64 and the soft member 66 are controlled by the stage control system 19. The drive unit 68 operates to move the hold member 64 in the Z direction in accordance with a Z-movement drive command ZMV output from the stage control system 19, and also operates to swingly move the hold member 64 about the section 64a in accordance with a swing-movement drive command RMV output from the stage control system 19. The movement of the hold member 64 is monitored by a limit switch, a position sensor, a rotary sensor or the like (not shown). The hold member 64 and the soft member 66 constitute a cleaning unit.

In the projection optical system of the present embodiment, pattern transfer is performed in the following manner.

Prior to pattern transfer onto the wafer W, cleaning is performed for the exposed substrate-opposed surface of the objective lens OB of the projection optical system PL. FIG. 11 illustrates the cleaning operation for the objective lens OB according to the present embodiment. In FIG. 11, for the purpose of explaining the cleaning operation more specifically, the soft member 66 and the components arranged near the objective lens OB are shown in section.

For cleaning, when the soft member 66 is placed at the initial position which is apart from a position beneath the projection optical system PL (see FIG. 11A), the stage control system 19 outputs a Z-movement drive command ZMV and a swing-movement drive command RMV successively to move the hold member 64 via a drive unit 68. In this way, the soft member 66 comes to contact with the substrate-opposed surface of the objective lens OB (see FIG. 11B).

Figure 11C:
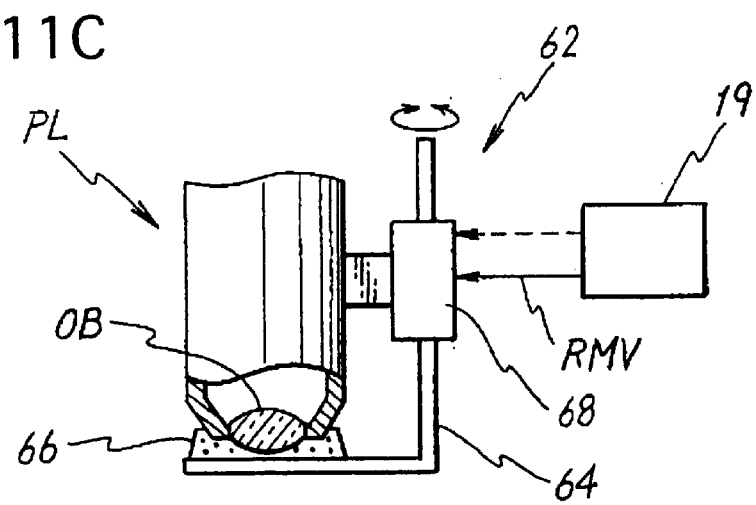

Next, in accordance with a command from the main control unit 20, the stage control system 19 outputs a swing-movement drive command RMV to swingly move the soft member 66 via a drive unit 68, so that the substrate-opposed surface of the objective lens OB is rubbed against the soft member 66 (see FIG. 11C). In this manner, the contamination on the substrate-opposed surface of the objective lens OB can be removed.

In accordance with a command from the main control unit 20, the stage control system 19 outputs a Z-movement drive command ZMV and a swing-movement drive command RMV successively to move the hold member 64 to the initial position.

After the cleaning operation is completed, as in the case of Embodiment 1, pattern transfer is performed as follows: the wafer W is held on the wafer holder 9 and aligned, the reticle R is illuminated with an exposure illumination light from the illumination system, a pattern defined on the reticle R is projected on the wafer W by the projection optical system PL, and the wafer W is then exposed to the light.

According to the present embodiment, as in the case of Embodiment 1, prior to pattern transfer, cleaning of the substrate-opposed surface of the optical member (i.e., the objective lens OB) of the projection optical system PL, which is disposed in the most vicinity to the exposure surface of the wafer W, is performed, thereby removing the contamination (e.g., a photosensitive agent) deposited on the substrate-opposed surface as a result of the previous pattern transfer. Consequently, satisfactory pattern transfer can be achieved under the conditions where the contamination of the substrate-opposed surface of the optical member is reduced and the projection optical system PL is brought closer to the wafer W without the presence of any intermediate other than the atmosphere.

As also in the case of Embodiment 1, it may be possible to analyze the relationship between the contamination level, the number of pattern transfer operations and the optical energy amount of the light irradiated onto the wafer W, and determine the limit on the number of pattern transfer operations (i.e., the number of exposure operations) until a clean substrate-opposed surface of an optical member is contaminated to a predetermined impermissible level. Based on the determined limit, the cleaning operation can be performed at any time during the contamination level does not exceeds the limit, for example, every time pattern transfer is performed for predetermined times, every time a light with a given optical energy is irradiated, or at regular intervals. As a result, it can be avoided to frequently halt the projection exposure apparatus for cleaning and, therefore, the workability of the apparatus can be improved.

The soft member 66 may be modified in the same manner as in Embodiment 1.

[Embodiment 5]

Hereinbelow, the projection exposure apparatus and method according to the fifth embodiment of the present invention (Embodiment 5) will be illustrated with reference to FIGS. 12 and 13. In the following description, the components similar to those in the above-described embodiments are denoted by the same reference numerals, and the overlapping explanatory descriptions are omitted.

Figure 12:
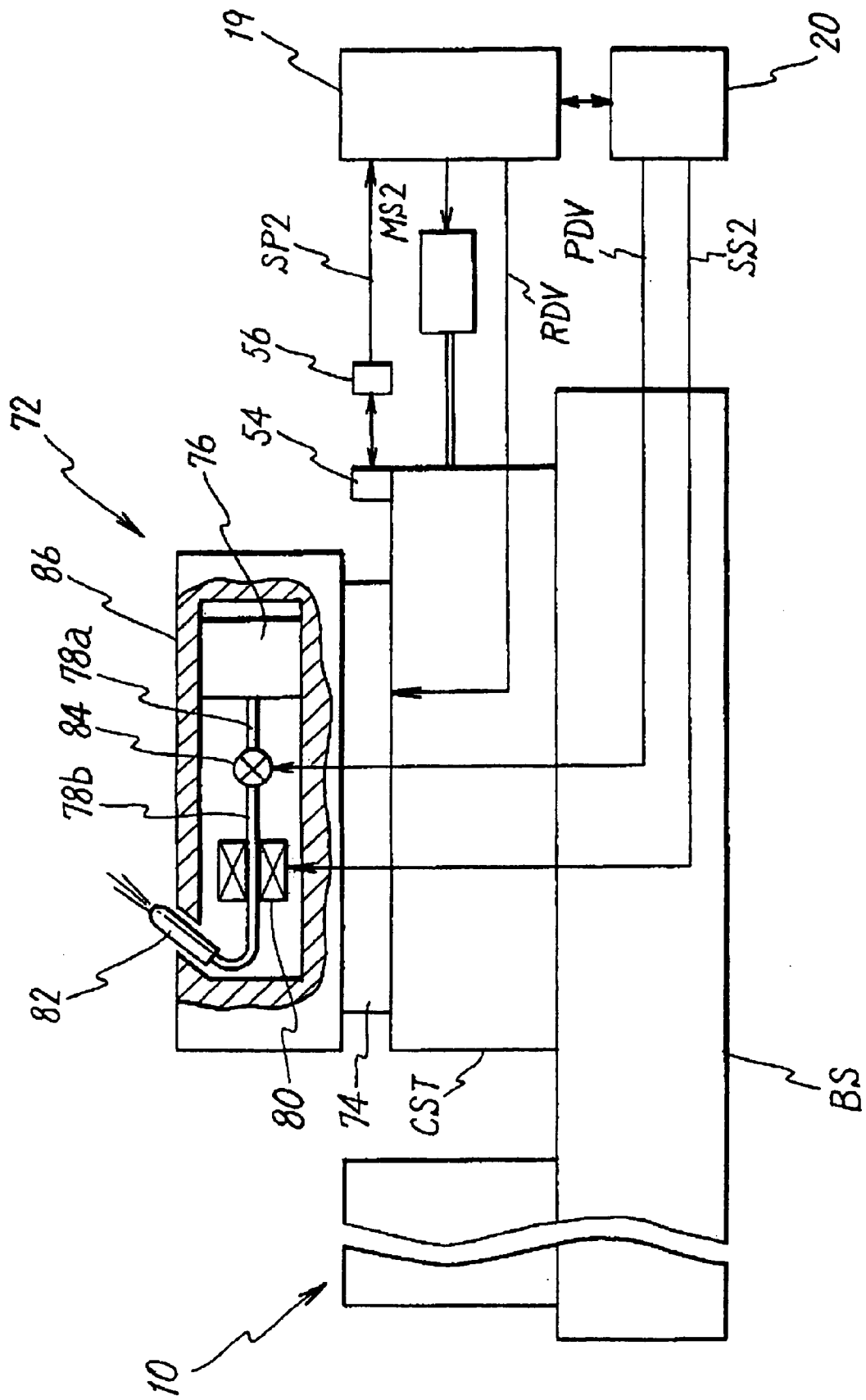
FIG. 12 is an illustration of a cleaning device in a projection exposure apparatus according to the fifth embodiment of the invention.
Figure 13A:
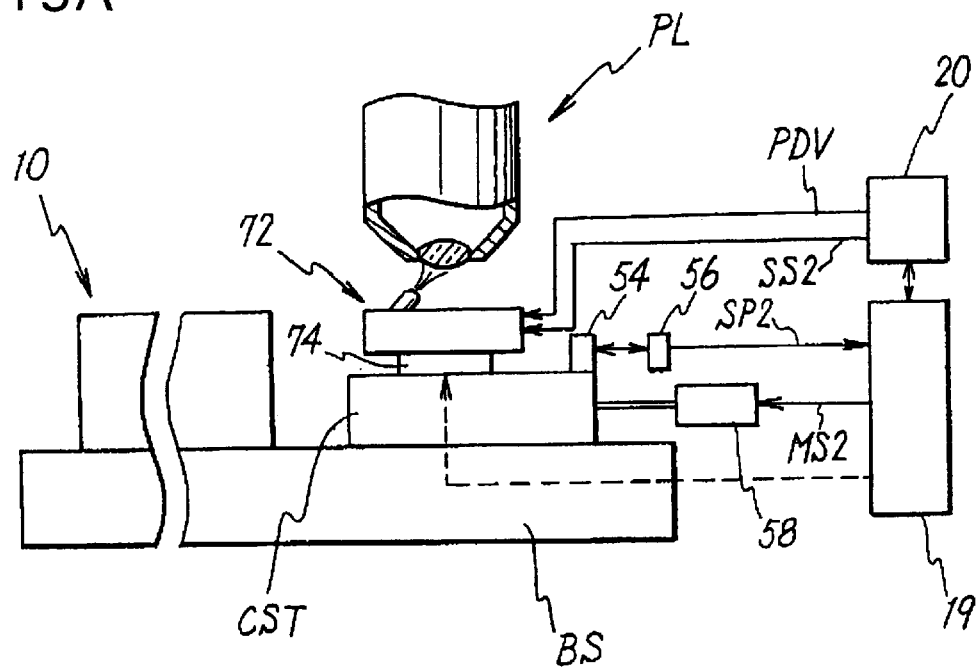
FIG. 13 is an illustration of assistance in explaining the cleaning process by a projection exposure apparatus according to the fifth embodiment of the invention.
Figure 13B:
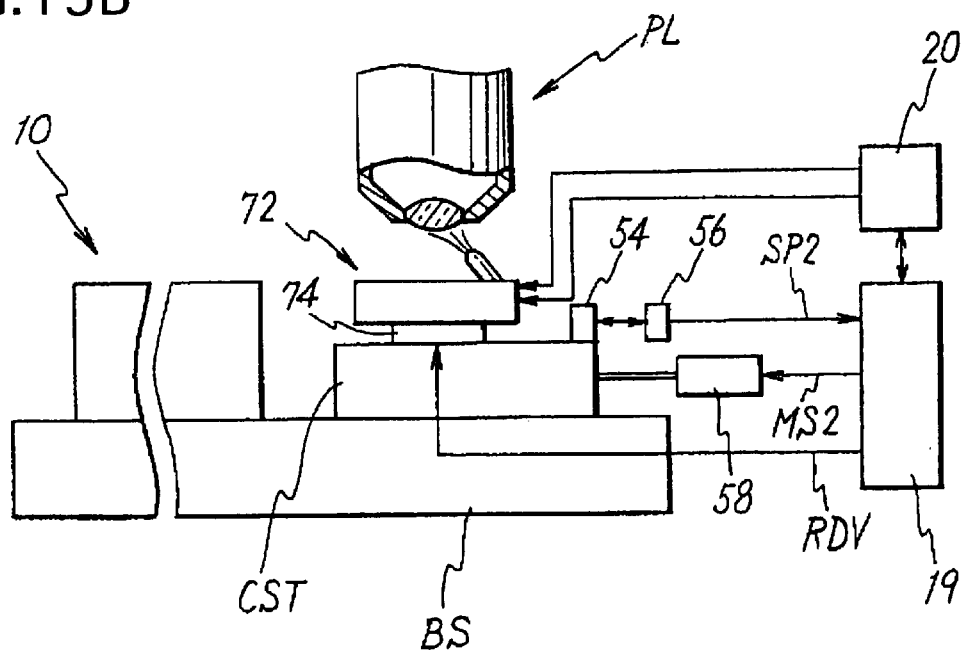

The projection exposure apparatus of the present embodiment is characterized in that the cleaning member 8 in the projection exposure apparatus of Embodiment 1 shown in FIG. 1 is replaced with a solution injector 72 shown in FIG. 12 schematically in section, which is disposed on a cleaning stage CST distinct from the wafer (substrate) stage WST. The objective lens OB of the projection optical system PL is cleaned using the solution injector 72 at the time when pattern transfer is not preformed.

As shown in FIG. 12, the solution injector 72 is disposed on the cleaning stage CST. The solution injector 72 is mounted on a rotary-movement drive unit 74 which operates to rotate the solution injector 72 in accordance with a rotary-movement drive command RDV output from the stage control system 19, and can inject ultrasonically vibrated liquid droplets in accordance with a command from the main control unit 20.

The cleaning stage CST is controlled by the stage control system 19, as in the case of Embodiment 2. The rotary-movement drive unit 74 is provided with a rotary movement sensor (not shown) which monitors the rotary-movement drive operation.

The solution injector 72 comprises a solution vessel 76 in which a cleaning solution is contained, flow-path setting members 78a and 78b which set or hold the flow path of the cleaning solution discharged from the solution vessel 76, an ultrasonic vibrator 80 which generates ultrasonic vibration in accordance with an ultrasonic vibration command SS2 output from the main control unit 20 to apply the ultrasonic vibration to the cleaning solution in the flow path held in the flow-path setting members 78a and 78b, a nozzle 82 for injecting the cleaning solution passed through the flow-path setting members 78a and 78b, a pump 84 for forcing the cleaning solution to flow toward the nozzle 82 through the flow-path setting members 78a and 78b in accordance with an injection command PDV output from the main control unit 20, and a housing 86.

As the cleaning solution, as in the case of Embodiment 2, water with high purity, acetone or a solution comprising a solvent for a photosensitive agent may be preferably used, provided that it causes no damage to the objective lens OB or a coat thereof.

In the projection exposure apparatus of the present embodiment, pattern transfer is performed in the following manner.

Prior to pattern transfer onto the wafer W, cleaning of the exposed substrate-opposed surface of the objective lens OB of the projection optical system PL is performed. FIG. 13 illustrates the cleaning operation for the objective lens OB according to the present embodiment.

For cleaning, in accordance with a command from the main control unit 20, the stage control system 19 operates to move the wafer stage WST away from a position beneath the projection optical system PL via the wafer stage drive unit 24. Subsequently, the stage control system 19 outputs a cleaning stage drive command MS2 based on the positional (or velocity) information SP2 for the cleaning stage CST, while checking the position of the cleaning stage CST, to move the cleaning stage CST in the X and Y directions via the cleaning stage drive unit 58. In this way, the ultrasonic cleaning device 40 is placed at a position which is beneath the projection optical system PL and at which the cleaning solution emitted through the nozzle 82 can be delivered to the substrate-opposed surface of the objective lens OB.

The main control unit 20 outputs an ultrasonic vibration command SS2 and an injection command PDV to cause ultrasonic vibration in the ultrasonic vibrator 80 and simultaneously feed the cleaning solution in the solution vessel 76 to the flow path. As a result, the ultrasonic vibration is applied to the cleaning solution flowing in the flow path in the flow-path setting member 78b, and the ultrasonically vibrated cleaning solution is emitted through the nozzle 82 toward the objective lens OB. In this manner, the substrate-opposed surface of the objective lens OB can be cleaned with the cleaning solution (see FIG. 13A).

Next, the stage control system 19 outputs a rotary-movement drive command RDV to rotate the injector 72 on the XY plane by 180° the rotary-movement drive unit 74. The stage control system 19 also outputs a cleaning stage drive command MS2 based on the positional (or velocity) information SP2 for the cleaning stage CST, while checking the position of the cleaning stage CST, to move the cleaning stage CST in the X and Y directions via the cleaning stage drive unit 58. In this way, the ultrasonic cleaning device 40 is placed at a position which is beneath the projection optical system PL and at which the cleaning solution emitted through the nozzle 82 can be delivered to the substrate-opposed surface of the objective lens OB.

The main control unit 20 outputs an ultrasonic vibration command SS2 and an injection command PDV to emit the ultrasonically vibrated cleaning solution through the nozzle 82 onto the objective lens OB, whereby the substrate-opposed surface of the objective lens is cleaned.

After the cleaning operation is completed, the stage control system 19 operates to move the cleaning stage CST away from a position beneath the projection optical system PL via the cleaning stage drive unit 58. As in the case of Embodiment 1, pattern transfer is then performed as follows: the wafer W is held on the wafer holder 9 and aligned, the reticle R is illuminated with an exposure illumination light from the illumination system, a pattern defined on the reticle R is projected on the wafer W by the projection optical system PL, and the wafer W is then exposed to the light.

According to the present embodiment, as in the case of Embodiment 1, prior to pattern transfer, cleaning of the substrate-opposed surface of the optical member (i.e., the objective lens OB) of the projection optical system PL, which is disposed in the most vicinity to the exposure surface of the wafer W, is performed to remove the contamination (e.g., a photosensitive agent) deposited on the substrate-opposed surface as a result of the previous pattern transfer. Consequently, satisfactory pattern transfer can be achieved under the conditions where the contamination of the substrate-opposed surface of the optical member is reduced and the projection optical system PL is brought closer to the wafer W without the presence of any intermediate other than the atmosphere.

As also in the case of Embodiment 1, it may be possible to analyze the relationship between the contamination level, the number of pattern transfer operations and the optical energy amount of the light irradiated onto the wafer W, and determine the limit on the number of pattern transfer operations (i.e., the number of exposure operations) until a clean substrate-opposed surface of an optical member is contaminated to a predetermined impermissible level. Based on the determined limit, the cleaning operation may be performed at any time during the contamination level does not exceeds the limit, for example, every time pattern transfer is performed for predetermined times, every time a light with a given optical energy is irradiated, or at regular intervals. As a result, it can be avoided to frequently halt the projection exposure apparatus for cleaning and, therefore, the workability of the apparatus can be improved.

In the present embodiment, the emission of the cleaning solution toward the objective lens OB is performed from two different directions. However, the emission from only one direction or three or more different directions may be possible.

The present embodiment is applicable in combination with, for example, Embodiment 1, 3 or 4. Particularly, when the cleaning operation of the other embodiment is performed sequentially after the cleaning operation of the present embodiment, the former may double as the operation for recovering the cleaning solution used in the latter.

In the present invention, ultrasonic vibration is applied to the cleaning solution. However, the cleaning solution may be emitted toward the objective lens OB without ultrasonic vibration. In this case, it is also possible to apply the present embodiment in combination with, for example, Embodiment 1, 3 or 4. When the cleaning operation of the other embodiment is performed sequentially after the cleaning operation of the present embodiment, the former may double as the operation for recovering the cleaning solution used in the latter.

[Embodiment 6]

Hereinbelow, the projection exposure apparatus and method according to the sixth embodiment of the present invention (Embodiment 6) will be illustrated with reference to FIGS. 14 and 15. In the following description, the components similar to those in the above-described embodiments are denoted by the same reference numerals, and the overlapping explanatory descriptions are omitted.

Figure 14:
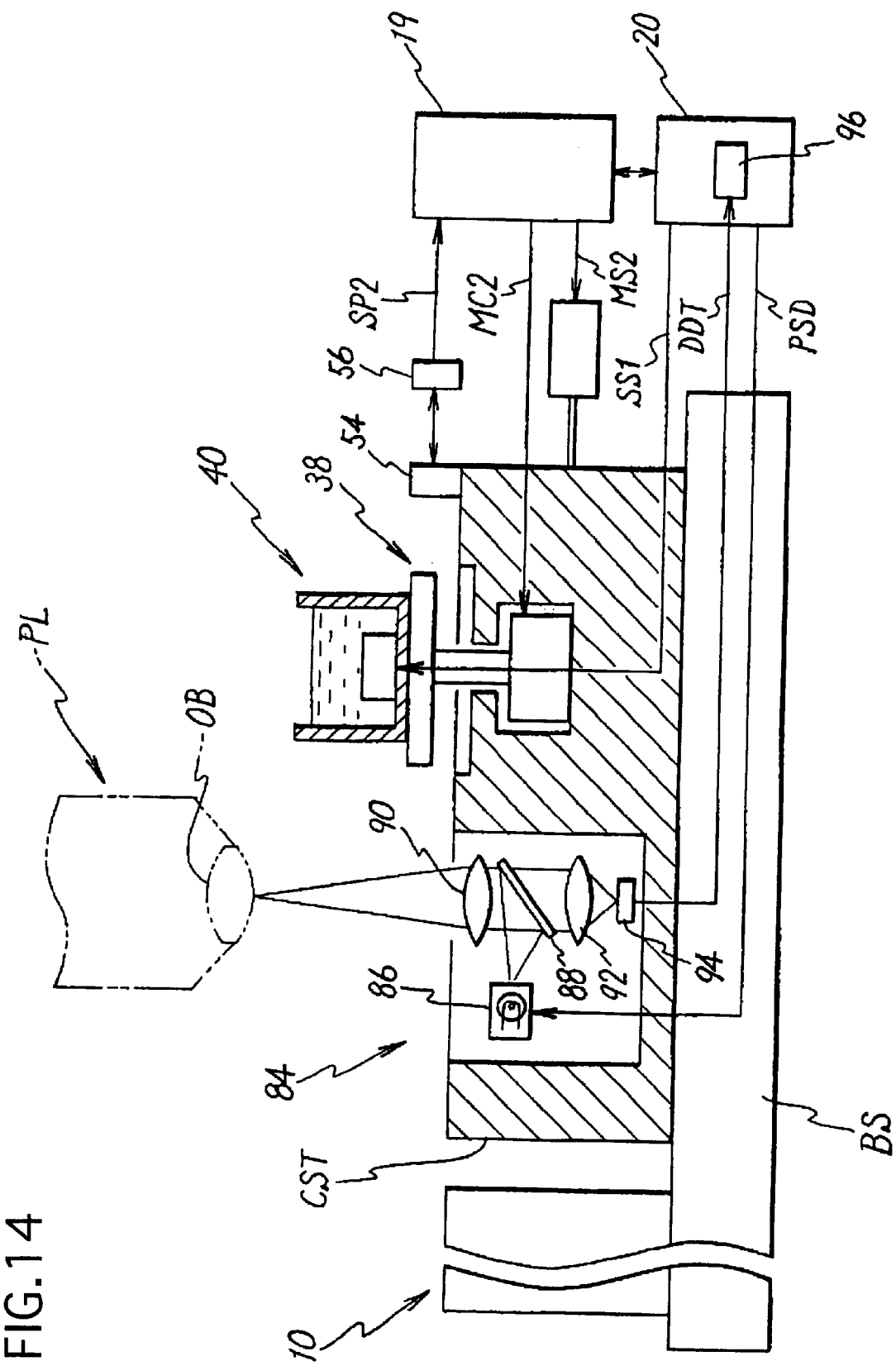
FIG. 14 is an illustration of a cleaning device in a projection exposure apparatus according to the sixth embodiment of the invention.
Figure 15A:
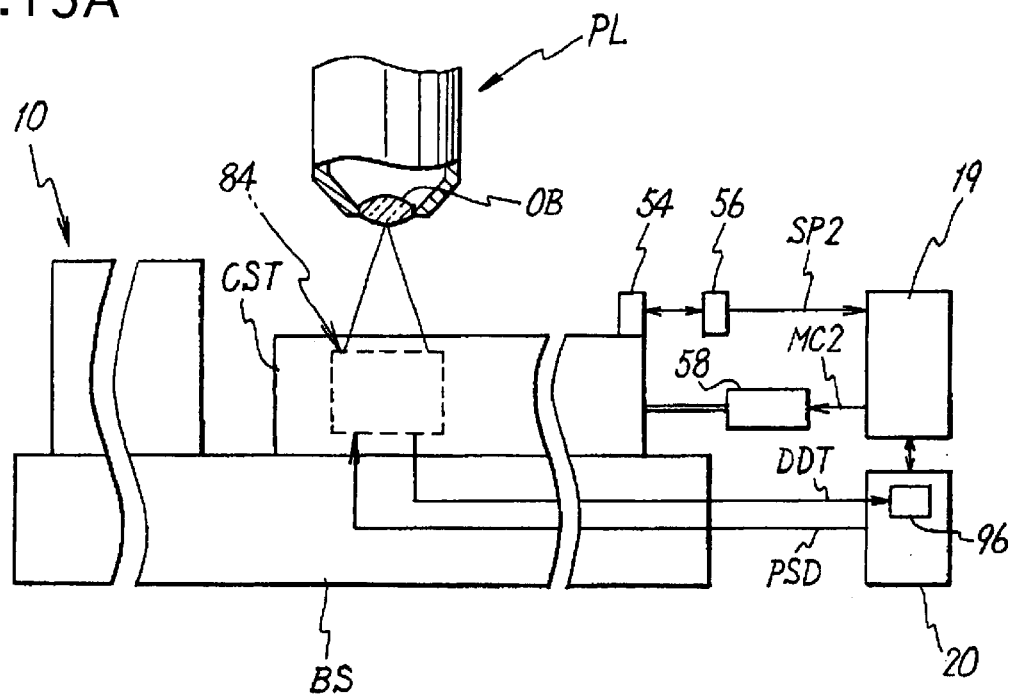
FIG. 15 is an illustration of assistance in explaining the cleaning process by a projection exposure apparatus according to the sixth embodiment of the invention.
Figure 15B:
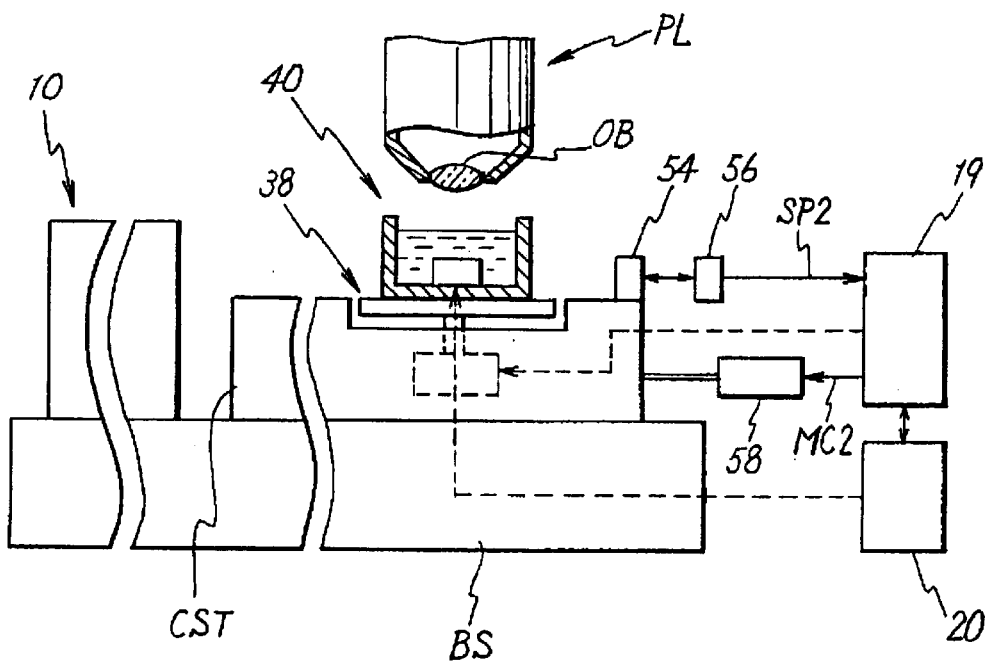

The projection exposure apparatus of the present embodiment is characterized in that the cleaning member 8 in the projection exposure apparatus of Embodiment 1 shown in FIG. 1 is replaced with an ultrasonic cleaning device 40 and a contamination inspection device 84 shown in FIG. 14 schematically in section. The objective lens OB of the projection optical system PL is inspected for contamination using the contamination inspection device 84 at the time when pattern transfer is not preformed and, if required, the objective lens OB is cleaned using the ultrasonic cleaning device 40.

The contamination inspection device 84 comprises a light source 86 which emits an inspection light in accordance with an emission command PSD output from a main control unit 20, an optical system comprising a half mirror 88 and lenses 90 and 92, a photodetector 94 which detects the inspection light reflected on the substrate-opposed surface of an objective lens OB, and a contamination inspection data processing unit 96 which determines the contamination level of the objective lens OB based on a detection result DDT output from the photodetector 94. The inspection light emitted from the light source 86 goes through the half mirror 88 and the lens 90 in this order and is irradiated on the substrate-opposed surface of the objective lens OB. The inspection light reflected on the substrate-opposed surface of the objective lens OB goes through the lens 90, the half mirror 88 and the lens 92 in this order and is imaged (focused) on a light-receiving surface of the photodetector 94. That is, in the present embodiment, the half mirror 88 and the lens 90 constitute an irradiation optical system, and the lenses 90 and 92 and the half mirror 88 constitute an imaging optical system.

As th e photodetector 94, a photodetector having a two-dimensionally arrayed photoelectric conversion unit may be preferably employed, such as a two-dimensional charge coupling device (CCD).

In the projection exposure apparatus of the present embodiment, pattern transfer is performed in the following manner.

Prior to pattern transfer onto the wafer W, the exposed substrate-opposed surface of the objective lens OB of the projection optical system PL is inspected for contamination and, if required, cleaning of the substrate-opposed surface is then performed. FIG. 15 illustrates the cleaning operation for the objective lens OB according to the present embodiment.

In accordance with a command from a main control unit 20, the stage control system 19 operates to move a wafer stage WST away from a position beneath the projection optical system PL via a wafer stage drive unit 24. Subsequently, the stage control system 19 outputs a cleaning stage drive command MS2 based on the positional (or velocity) information SP2 for the cleaning stage CST, while checking the position of the cleaning stage CST, to move the cleaning stage CST in the X and Y directions via the cleaning stage drive unit 58. In this way, The optical system of the contamination inspection device 84 is placed at a position which is beneath the projection optical system PL and at which the inspection light can be irradiated onto the substrate-opposed surface of the objective lens OB.

The main control unit 20 outputs an emission command PSD to generate the inspection light in the light source 86. The inspection light emitted from the light source 86 goes through the irradiation optical system and irradiated on the substrate-opposed surface of the objective lens OB. The inspection light reflected on the substrate-opposed surface of the objective lens OB is incident upon a light-receiving surface of the photodetector 94 through an imaging optical system. In the photodetector 94, the inspection light is detected. The detection result from the photodetector 94 is issued to the contamination inspection data processing unit 96, where the contamination level is determined (see FIG. 15A).

Based on the contamination inspection result, the main control unit 20 determines whether or not cleaning may be needed. This determination is made by such a criteria that the subsequent exposure operation can be performed under a condition where the contamination level of the objective lens is lower than or equal to a predetermined limit. The necessity of cleaning is judged as "No" if the subsequent exposure is possible, while it is judges as "Yes" if the subsequent exposure is impossible.

When the necessity of cleaning is judged as "No", the stage control system 19 operates to move the cleaning stage CST away from a position beneath the projection optical system PL via a cleaning device drive unit 58. As in the case of Embodiment 1, pattern transfer is then performed as follows: the wafer W is held on the wafer holder 9 and aligned, the reticle R is illuminated with an exposure illumination light from the illumination system, a pattern defined on the reticle R is projected on the wafer W by the projection optical system PL, and the wafer W is then exposed to the light.

If the necessity of cleaning is judged as "Yes", in accordance with a command from the main control unit 20, the stage control system 19 outputs a cleaning stage drive command MS2 based on the positional (or velocity) information SP2 for the cleaning stage CST, while checking the position of the cleaning stage CST, to move the cleaning stage CST in the X and Y directions via the cleaning stage drive unit 58. In this way, the ultrasonic cleaning device 40 is place beneath the projection optical system PL (see FIG. 15B). Subsequently, cleaning of the objective lens OB is performed in the same manner as in Embodiment 2.

Next, in accordance with a command from the main control system 20, the stage control system 19 outputs a cleaning stage drive command MS2 based on the positional (or velocity) information SP2 for the cleaning stage CST to move the cleaning stage CST in the X and Y directions via the cleaning stage drive unit 58. In this way, the optical system of the contamination inspection device 84 is placed at a position which is beneath the projection optical system PL and at which the inspection light can be irradiated onto the substrate-opposed surface of the objective lens OB. The cleaning effect is confirmed by inspecting the substrate-opposed surface of the objective lens OB for contamination using the contamination inspection device 84 in the same manner as for the above-mentioned contamination inspection.

When a satisfactory cleaning effect is confirmed, the stage control system 19 operates to move the cleaning stage CST away from a position beneath the projection optical system PL via the cleaning stage drive unit 58. As in the case of Embodiment 1, pattern transfer is then performed as follows: the wafer W is held on the wafer holder 9 and aligned, the reticle R is illuminated with an exposure illumination light from the illumination system, a pattern defined on the reticle R is projected on the wafer W by the projection optical system PL, and the wafer W is then exposed to the light. If the cleaning effect is unsatisfactory, the cleaning and the confirmation of cleaning effect are repeated.

According to the present embodiment, prior to pattern transfer, since the substrate-opposed surface of the optical member (i.e., the objective lens OB) of the projection optical system PL arranged in the most vicinity to the exposure surface of the wafer W is inspected for contamination caused by, for example, a photosensitive agent as a result of the previous pattern transfer and then, if required, is cleaned. Consequently, satisfactory pattern transfer can be achieved under the conditions where the contamination of the substrate-opposed surface of the optical member is reduced and the projection optical system PL is brought closer to the wafer W without the presence of any intermediate other than the atmosphere.

In the present embodiment, the contamination inspection device is incorporated in the apparatus of Embodiment 2. However, the contamination inspection contamination may also be employed in combination with the apparatus of any of Embodiments 1 and 3–5.

The contamination inspection may also be performed using an exposure illumination light as the inspection light and detecting the light transmitted through the objective lens OB. In this case, however, it should be noted that range of choices for the optical member of the inspection optical system is limited, because it is required to use an optical member which can transmit a UV light.

[Embodiment 7]

Hereinbelow, the projection exposure apparatus and method according to the seventh embodiment of the present invention (Embodiment 7) will be illustrated with reference to FIGS. 16 and 17. In the following description, the components similar to those in the above-described embodiments are denoted by the same reference numerals, and the overlapping explanatory descriptions are omitted.

The projection exposure apparatus of the present embodiment is designed to perform projection exposure of a wafer W while preventing the approach of contaminants onto an optical member of a projection optical system which is arranged in the most vicinity of the wafer W during pattern transfer. FIG. 16 shows the projection exposure apparatus of the present embodiment schematically in section.

Figure 16:
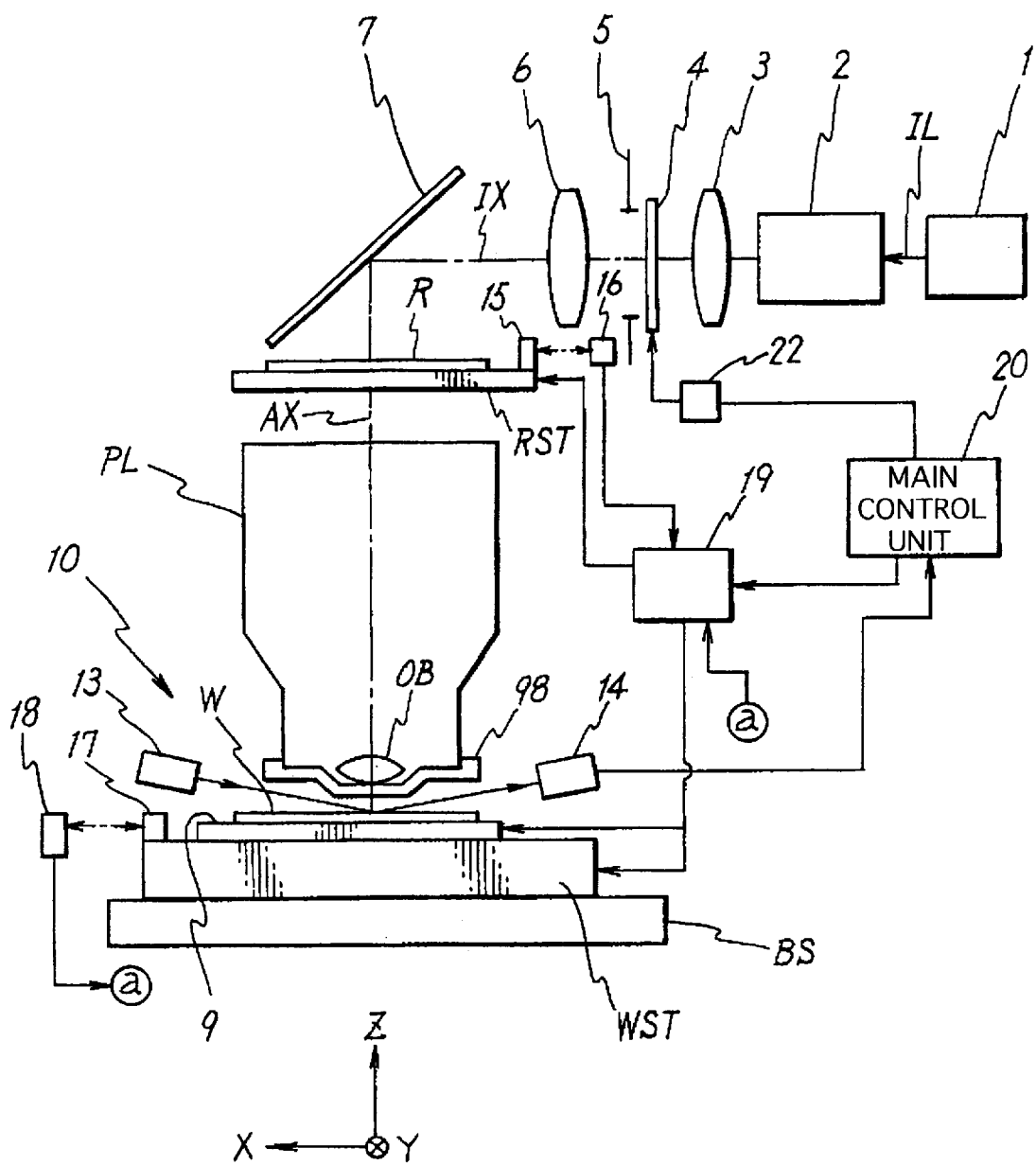
FIG. 16 is a schematic illustration of a projection exposure apparatus according to the seventh embodiment of the invention.
Figure 17:
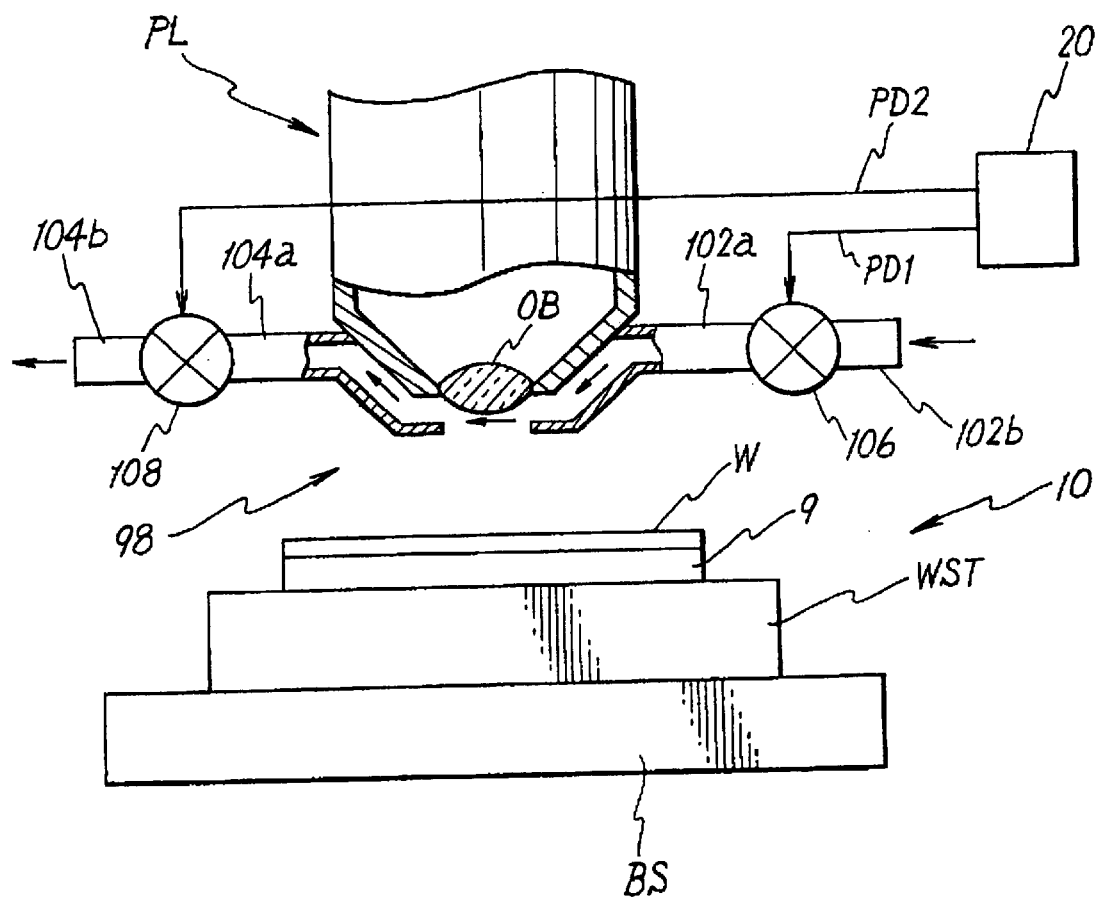
FIG. 17 is an illustration of a contamination protection device in the apparatus shown in FIG. 16.

The projection exposure apparatus of the present embodiment is characterized in that, as shown in FIG. 16, the cleaning member 8 in the projection exposure apparatus of Embodiment 1 shown in FIG. 1 is replaced with a contamination protection device 98 shown in FIG. 17 schematically in section.

As shown in FIG. 17, the contamination protection device 98 comprises flow-path setting members 102a, 102b, 104a and 104b which preset the flow path of an ambient air, a suction pump 106 which takes in the ambient air from the opening of the flow-path setting member 102b and supplies the ambient air to the flow-path setting member 102a through the flow-path setting member 102b, and an exhaust pump 108 which exhausts the ambient air passing through the flow-path setting member 104a, from the opening of the flow-path setting member 104b. The openings of the flow-path setting members 102a and 104a are adapted to be connected with each other with respect to the flow of the ambient air, but arranged apart from each other physically at least in the vicinity of the objective lens OB, and not to extend even to the travelling path of the exposure illumination light. Therefore, the exposure illumination light emitted from the projection optical system PL reaches the wafer W only through the ambient air.

The suction pump 106 effects the suction of the ambient air in accordance with a suction command PD1 output from the main control unit 20. The exhaust pump 108 effects the exhaustion of the ambient air in accordance with an exhaust command PD2 output from the main control unit 20.

In the projection optical system of the present embodiment, pattern transfer is performed in the following manner.

The main control unit 20 outputs a suction command PD1 and an exhaust command PD2 to cause the flow of the ambient air through flow paths 102b, 102a, 104a and 104b in this order. Next, the wafer W is held on the wafer holder 9 and aligned for exposure, the reticle R is illuminated with an exposure illumination light from the illumination system, a pattern defined on the reticle R is projected on the wafer W by the projection optical system PL, and the wafer W is then exposed to the light.

In the projection exposure apparatus of the present embodiment, pattern transfer is performed under the flow of the condition where the ambient air surrounding the substrate-opposed surface of the optical member arranged in the vicinity of the wafer W (i.e., an objective lens OB of the projection optical system PL). That is, pattern transfer is performed under the condition where any intermediate other than the ambient air is not present in the travelling path of the exposure illumination light between the projection optical system PL and the wafer W, while simultaneously preventing the approach of contaminants released from the wafer W (i.e., the substrate) to the objective lens OB, by the flow of the ambient air. Consequently, satisfactory pattern transfer can be achieved under the conditions where the contamination of the substrate-opposed surface of the optical member is reduced and the projection optical system PL is brought closer to the wafer W without the presence of any intermediate other than the atmosphere.

In the present embodiment, the ambient air is employed. However, any other gas may be applicable.

The present invention is not limited to those embodiments, and is intended to encompass various modifications. For example, in each of the embodiments, an objective lens is used as the target optical member to be arranged in the most vicinity of the wafer W on the optical path of the exposure illumination light during pattern transfer. However, when additional optical member (e.g., one for optical path correction) is arranged downstream of the objective lens on the optical path of the exposure illumination light, any of the embodiments may be applied in combination for cleaning or contamination-protection of the additional optical member.

In the present invention, the optical member to be targeted for cleaning is not limited to one which is arranged at the end part of a projection optical system, and any other type of optical member may be targeted, such as one arranged at the end part of a focus detection optical system for detecting the position of the wafer W or an alignment optical system.

The contamination detection device of Embodiment 6 may be used singly rather than in combination with the cleaning device. In this case, the optical member to be targeted for the inspection may be replaced with a new one before the inspection result from the contamination inspection device exceeds the limit.

In each of the above-described embodiments, the wafer stage or the cleaning stage distinct from the wafer stage may be of a guide-less type one which can be driven in a levitated state on a two-dimensional flat-paneled motor, or may be one with a mechanical guide.

[Embodiment 8]

Hereinbelow, the projection exposure apparatus and method according to the eighth embodiment of the present invention (Embodiment 8) will be illustrated with reference to FIGS. 18 and 19. In the following description, the components similar to those in the above-described embodiments are denoted by the same reference numerals, and the overlapping explanatory descriptions are omitted. In the explanation of the present embodiment, as shown in FIG. 18, Z axis is defined as an axis parallel to the optical axis AX of the projection optical system PL, X axis is defined as an axis parallel to the page of FIG. 18 on a plane orthogonal to the optical axis AX, and Y axis is defined as an axis perpendicular to the page of FIG. 18.

The projection exposure apparatus of the present embodiment is used for projectionally exposing a circuit pattern onto each shot region on the wafer W while steppingly moving the wafer W during the exposure. However, since FIG. 18 merely is intended to illustrate the stage of the projection optical system PL during inspection for contamination, the wafer W is not placed at the exposure position in FIG. 18. The wafer stage WST used in the present embodiment does not particularly require the mechanism of the center-up 12 described in Embodiment 1.

The optical cleaning device is described in the following.

Figure 18:
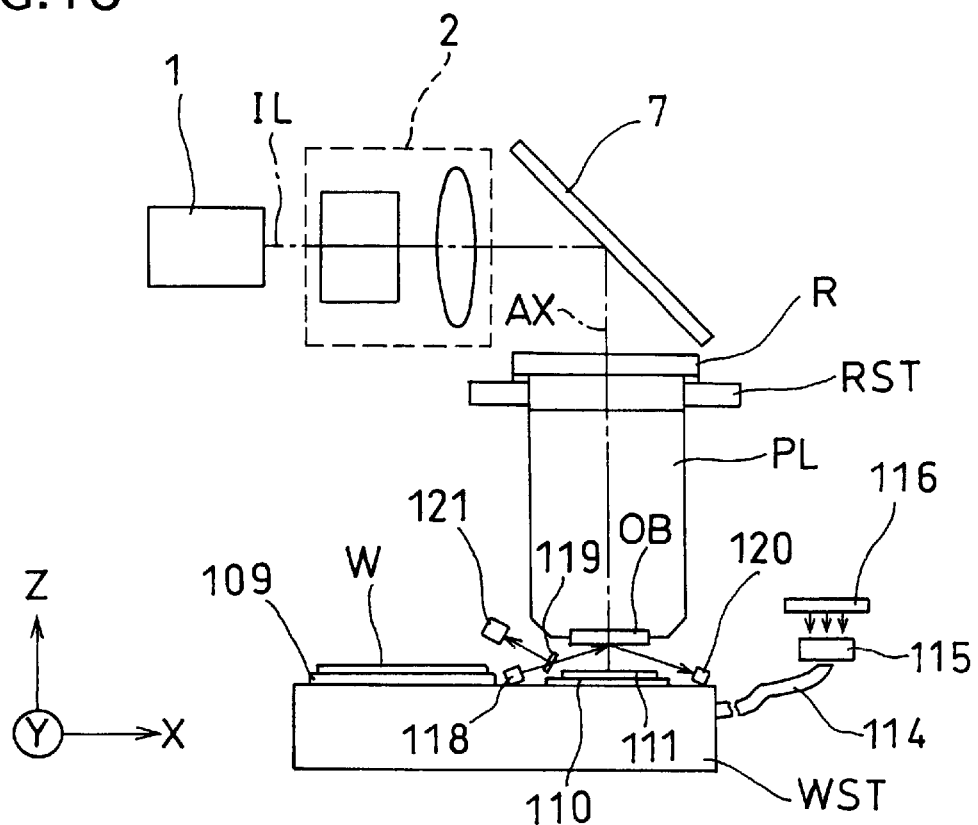
FIG. 18 is a general illustration of a projection exposure apparatus according to the eighth embodiment of the present invention.
Figure 19:
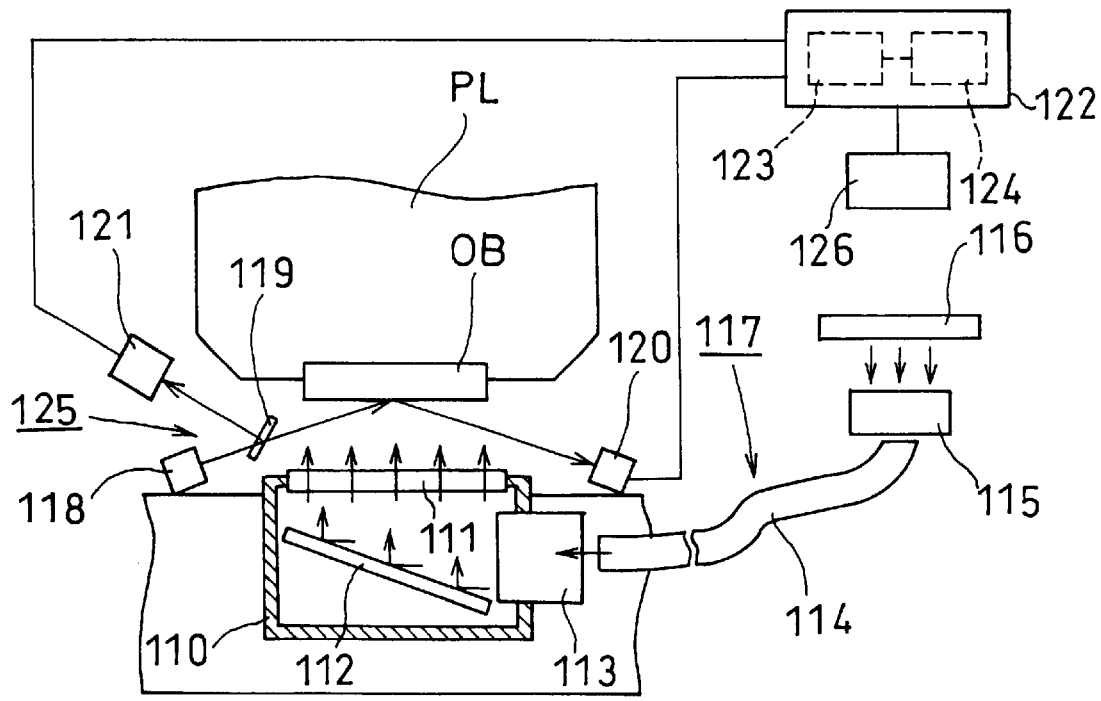
FIG. 19 is a schematic illustration of the essential part of the eighth embodiment of the present invention.

As shown in FIGS. 18 and 19, a casing 110 is buried and fixed in a wafer stage WST in the vicinity of a Z stage 109 so that the upper part of the casing 110 is slightly exposed out of the wafer stage WST. A window 111 made of, for example, synthetic quartz which can transmit UV light with good efficiency is fitted removably and replaceably onto the upper part of the casing 110, and a mirror 112 is disposed at an angle in the interior of the casing 110. On the side wall of the casing 110, there is provided a beam expander optical system 113. In the vicinity of the beam expander optical system 113, there is disposed a light-exiting end of an optical fiber 114 introduced from the outside of the wafer stage WST. In the outside of the wafer stage WST, a condensing lens 115 is disposed at the light-incident end of the optical fiber 114, so that UV light emitted from an irradiation light source 116 (ArF excimer laser) which is distinct from the exposure light source 1) is irradiated onto the condensing lens 115. That is, in the present embodiment, the mirror 112, the optical fiber 114, the irradiation light source 116 and so on constitute an optical cleaning device 117.

The projection optical system inspection device of the present embodiment is explained in the following.

As shown in FIGS. 18 and 19, a light emission unit 118 is provided in the vicinity of the exposed part of the casing 110 on the wafer stage WST. The light emission unit 118 is adapted to irradiate a given irradiation light onto the surface of the objective lens OB upwardly from a slanting direction. A diverging mirror 119 is arranged on the optical path between the surface of the objective lens OB and the light emission unit 118. In the present embodiment, although a plane parallel optical element is exemplary used as the objective lens OB, a concave or convex lens may also be used. A first light-receiving member 120 is disposed on the wafer stage WST, which receives the light from the light emission unit 118 reflected on the surface of the objective lens OB. A second light-receiving member 121 is disposed above the wafer stage WST, which receives the light from the light emission unit 118 diverged on the diverging mirror 119. The outputs from the first and second light-receiving members 120 and 121 are supplied to an inspection control system 122 constituting an inspection mean in the forms of photoelectric signals.

As shown in FIG. 19, the inspection control system 122 is provided with a computation unit 123 and a memory 124. The computation unit 123 computes an optical reflectance on the surface of the objective lens OB as a real (actual) reflectance based on the photoelectric signals output from the light-receiving members 120 and 121, and then determines the contamination level of the surface of the objective lens OB based on the comparison result between the computed real reflectance and a predetermined reflectance stored in the memory 124. The predetermined reflectance is stored in advance in the memory 124 as an optical reflectance on the surface of the objective lens OB in the projection exposure apparatus in which the surface of the objective lens OB is assumed not to be contaminated to such a level that the contamination affects the optical characteristics of the projection optical system, which is measured immediately after the apparatus is manufactured. In the present embodiment, the light emission unit 118, the first and second light-receiving members 120 and 121 and the inspection control system 122 constitute the projection optical system inspection device 125. The inspection result for surface contamination level from the projection optical system inspection device 125 is displayed by a display means 126. The contamination level of the surface of the objective lens OB in the projection optical system PL can be ascertained objectively from the displayed result.

The function of the above-constituted projection exposure apparatus of the present embodiment is explained in the following.

The wafer stage WST is moved to a contamination-inspecting position shown in FIG. 18 in accordance with the drive control by the main control system (not shown). Then, the window 111 on the casing 110 is placed immediately beneath the objective lens OB arranged at the lowermost part of the projection optical system PL. Under this situation, the main control system operates to control the irradiation timing for the irradiation light from the light emission unit 118 at regular intervals. When a given irradiation light is emitted from the light emission unit 118 by in accordance with the light emission control by the main control system, the irradiated light partly passes through the diverging mirror 119 and travels to the surface of the objective lens OB, on which the light is reflected. The reflected light is received by the first light-receiving member 120. On the other hand, the irradiated light diverged by the diverging mirror 119 (i.e., a diverged light) is received by the second light-receiving member 121 without traveling to the surface of the objective lens OB. Photoelectric signals which had been photoelectrically converted by the light-receiving members 120 and 121 are separately input to the inspection control system 122.

The computation unit 123 in the inspection control system 122 computes a reflectance on the surface of the objective lens OB based on the photoelectric signals from the first and second light-receiving members 120 and 121. In general, when light is incident upon an interface between two media at a specific incident angle, the reflectance R is represented by the formula: $R=I_r/I_0$ [wherein "$I_0$" denotes an energy intensity of the incident light flux and "$I_r$" denotes an energy intensity of the reflected light flux]. According to the formula, the computation unit 123 computes a real reflectance $R_r$ on the surface of the objective lens OB by employing an energy intensity determined based on a photoelectric signal from the first light-receiving member 120 as $I_r$ and an energy intensity determined based on a photoelectric signal from the second light-receiving member 121 as $I_0$.

Next, in the inspection control system 122, the computing unit 123 reads the predetermined reflectance $R_0$ from the memory 124, computes the difference $\Delta R$ between the predetermined reflectance $R_0$ and the real reflectance $R_r$ (i.e., $\Delta R=R_0-R_r$) and then outputs a display signal based on the difference $\Delta R$ to a display means 126. The display means 126 numerically displays a contamination level of the surface of the objective lens OB based on the display signal.

The display signal determined based on the difference $\Delta R$ between the both reflectances $R_0$ and $R_r$ is also output into the main control system. The main control system determines where it is judged whether or not the numerical value for contamination level determined based on the display signal falls within a predetermined permissible range. When the numerical value is judged as "out-of-range", the main control system operates to generate an irradiation light in the irradiation light source 116. The irradiation light from the irradiation light source 116 is guided to the casing 110 through the condensing lens 115, the optical fiber 114 and the beam expander optical system 113. The irradiation light introduced into the casing 110 turns its direction by the mirror 112 so that the irradiation light irradiates the entire surface of the objective lens OB through the window 111.

In the vicinity of the surface of the objective lens OB, oxygen in the air absorbs the irradiation light (i.e., UV light) and is shifted to an exited state, whereby the oxygen is chemically converted into ozone which has an increased oxidative effect. The adsorption of the irradiation light (UV light) by oxygen is known as the "Schumann-Runge adsorption". In order to cause the Schumann-Runge adsorption, such an irradiation light source may be used that can emits a light with a wavelength of 200 nm or shorter at which adsorption of the light by oxygen is increased. In the present embodiment, since an ArF excimer laser with a wavelength of 193 nm is used as the irradiation light source 116, the Schumann-Runge adsorption occurs. Therefore, volatile materials, which are generated from a photosensitive agent (a novolak resin) applied on the wafer W, on the surface of the objective lens OB can be oxidatively decomposed by the irradiation light under the atmosphere where the oxidative effect by the Schumann-Runge adsorption is enhanced. In this manner, the surface of the objective lens OB in the projection optical system PL can be optically cleaned.

As mentioned above, when the light emission of the light emission unit 118 is repeatedly controlled by the main control system at regular intervals, the inspection control system 122 computes the difference ΔR between the predetermined reflectance $R_0$ and a real reflectance $R_r$ in the same manner as mentioned above every time the light emission control is performed, and outputs a newly issued display signal based on each computed result into the display means 126. The display means 126 numerically displays a contamination level of the surface of the objective lens OB based on the display signal.

The main control system also determines whether or not the numerical value for contamination level determined based on the newly issued display signal falls within the predetermined permissible range. When the numerical value is judged as "out-of-range", the main control system directs to generate an irradiation light in the irradiation light source 116 again. Thus, the surface of the objective lens OB is optically cleaned again by the irradiation of the irradiation light from the irradiation light source 116 in the same manner as mentioned above. During the emission control for the light emission unit 118 by the main control system is repeatedly performed, at the time when the main control system judges the numerical value for contamination level determined based on the display signal as falling within the predetermined permissible range, the optical cleaning operation for the surface of the objective lens OB with the irradiation light from the irradiation light source 116 is completed.

According to the present embodiment, the above-described constitution of the projection exposure apparatus can provide the following beneficial effects.

(1) In the present invention, the projection optical system inspection device 125 is provided to determine the contamination level of the surface of the objective lens OB in the projection optical system PL. That is, the contamination level of the surface of the objective lens OB can be determined based on the inspection result output from the inspection control system 122 in the projection optical system inspection device 125, and it is determined whether or not the cleaning operation is necessary.

Accordingly, it can be avoided such a situation that, even though there is a necessity of cleaning, contamination of the surface of the objective lens OB is ignored and a timing of performing the cleaning operation is lost, and it can be ensured to prevent the occurrence of exposure failure caused by leaving the surface of the objective lens OB contaminated.

Moreover, since the contamination level is determined based on the inspection result output from the inspection control system 122, the possibility of cleaning operations unnecessary for maintenance can be eliminated. Therefore, for example, even when wipe-off-cleaning or the like is performed manually without using the optical cleaning device 117, the opportunity for the projection optical system PL to be exposed to outside air when the apparatus case is opened, can be minimized and, therefore, a possibility of worsening the light exposure conditions can be reduced.

(2) In the present embodiment, the predetermined reflectance $R_0$ is defined as an optical reflectance on the surface of the objective lens OB which is assumed not to be contaminated to such a level that the contamination affects the optical characteristics of the projection optical system, which is measured immediately after the projection exposure apparatus is manufactured, and the cleaning operation is performed only when a numerical value for contamination level determined based on the difference ΔR between the predetermined reflectance $R_0$ and an actually determined reflectance $R_r$ is out of the certain permissible range.

Accordingly, since the criteria of judgement for the necessity of cleaning is clear and objective, the reliability of determined numerical values for contamination levels can be improved. Further, since an undesirable variation in timing of the cleaning operation can be avoided, the cleaning of the surface of the objective lens OB effectively only when required. Moreover, since the contamination level is determined based on the optical reflectance on the surface of the objective lens OB, it can be known readily the presence of absence of the surface contamination which may affect the optical characteristics of the projection optical system PL.

(3) In the present embodiment, an ArF excimer laser which emits an UV light with a wavelength of 193 nm is used as the irradiation light source 116, and the contamination on the surface of the objective lens OB is removed by the optical cleaning with the irradiation light from the irradiation light source 116 by the effect of the Schumann-Runge adsorption. Therefore, the contaminants adhered onto the surface can be oxdatively decomposed under the atmosphere where the oxidative effect is enhanced by the effect of the Schumann-Runge adsorption, and the cleaning operation can be performed with good efficiency. Moreover, unlike a manual wipe-off-cleaning, the cleaning operation of the present embodiment has no possibility to worsening the optical characteristics of the projection optical system PL.

(4) In the present embodiment, the light emission unit 118 in the projection optical system inspection device 125 is repeatedly controlled by the main control system at regular intervals, and correspondingly the surface contamination level of the objective lens OB is inspected repeatedly during cleaning the surface of the objective lens OB by the optical cleaning device 117. Therefore, it is not likely that the cleaning operation by the optical cleaning device 117 is finished before the contamination of the surface of the objective lens OB is cleaned completely, and it is ensured that the contamination of the surface of the objective lens OB can be removed by the cleaning operation.

(5) In the present embodiment, since the contamination level inspection results from the projection optical system inspection device 125 is displayed by the display means 126, the contamination level of the surface of the objective lens OB can be checked by a cleaning operator every cleaning operation. Therefore, even when the cleaning operation is performed manually rather than the light emission control for the irradiation light source 116 by the main control system, the cleaning operation can be performed properly in accordance with the display description by the display means 126.

(6) In the present embodiment, the window 111 fitted to the upper part of the casing 110 in the optical cleaning device 117 is removable and replaceable. Therefore, if the window 111 is damaged or the like, it may be replaced with a new one readily, and therefore a good optical cleaning effect can be maintained.

[Embodiment 9]

Hereinbelow, the ninth embodiment of the present invention (Embodiment 9) will be illustrated with reference to FIG. 20. The present embodiment has the same construction as Embodiment 8, except that a gas supply means 127 is additionally provided to the optical cleaning device 117. Although the projection optical system inspection device 125 comprising the light emission unit 118 and so on is not shown in FIG. 20, the projection optical system inspection device 125 is also provided in the present embodiment. Therefore, only the gas supply means 127 is explained below, and the components shared with Embodiment 8 are denoted by the same reference numerals in the figure, and the overlapping explanatory descriptions are omitted.

Figure 20:
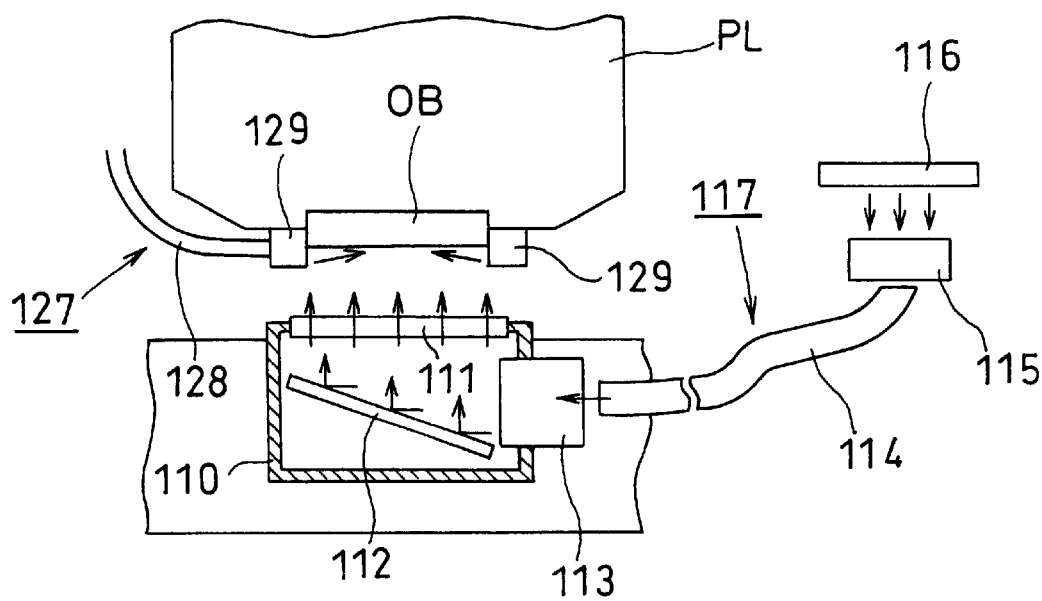
FIG. 20 is a schematic illustration of the essential part of the ninth embodiment of the present invention.

As shown in FIG. 20, in the present embodiment, a gas supply means 127 is provided in the vicinity of the objective lens OB on the projection optical system PL. The gas supply means 127 comprises a gas supply pipe 128 which is provided extending from an ozone gas generator (not shown) and a gas supply opening 129 which is connected to the pipe 128 and arranged to surround the objective lens OB, in which the gas supply of an oxidation-promoting gas (e.g., ozone gas) is controlled by the main control system.

For the optical cleaning of the surface of the objective lens OB by the optical cleaning device 117, the main control system operates to control light emission of the irradiation light source 116 and initiate the gas supply by the gas supply means 127. Ozone gas is blown through the gas supply opening 129 toward the surface of the objective lens OB to fill the atmosphere surrounding the surface of the objective lens OB with ozone gas. Under this situation, the irradiation light is irradiated from the irradiation light source 116 to the surface of the objective lens OB. In this way, the contaminants such as organic materials attached onto the surface of the objective lens OB are oxidatively decomposed with the irradiation light from the irradiation light source 116 under the atmosphere where the oxidative effect caused by the Schumann-Runge adsorption is enhanced.

As described above, in the present embodiment, since the vicinity of the surface of the objective lens OB is surrounded by a highly oxidative ozone gas atmosphere by supplying ozone gas from the gas supply means 127, the optical cleaning effect of the optical cleaning device 117 can be increased. As the method for generating ozone gas, various methods are known, such as methods by means of electric discharge or UV ray, and any of such methods may be applicable to the present embodiment. The gas supplied by the gas supply means 127 is not particularly limited to ozone gas, and any other oxidative gas may also be used as long as it is suitable for enhancement of oxidative decomposition of organic materials onto the surface of the objective lens OB.

[Embodiment 10]

Hereinbelow, the tenth embodiment of the present invention (Embodiment 10) will be illustrated with reference to FIG. 21. The present embodiment has the same construction as Embodiment 8, except that a gas supply means 127 and a gas collection means 130 are additionally provided to the optical cleaning device 117. Therefore, only the gas supply means 127 and the gas collection means 130 are explained below, and the overlapping explanatory descriptions for the components shared with Embodiment 8 are omitted.

Figure 21:
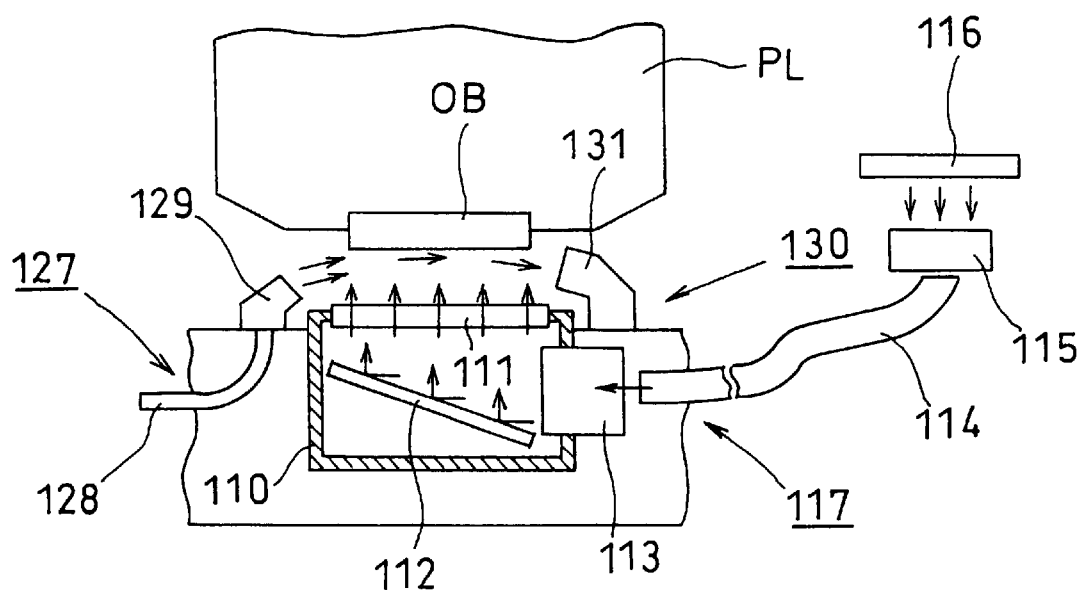
FIG. 21 is a schematic illustration of the essential part of the tenth embodiment of the present invention.

As shown in FIG. 21, in the gas supply means 127 of the present embodiment, the gas supply pipe 128 extending from an ozone gas generator (not shown) is buried in the wafer stage WST. The gas supply opening 129 connected to the gas supply pipe 128 is disposed on the wafer stage WST in the vicinity of the casing 110 so that ozone gas is fed toward the surface of the objective lens OB. A gas suction opening 131 is provided on the wafer stage WST on the opposite side to the gas supply opening 129 relative to the casing 110. The gas suction opening 131 together with a gas collection pipe (not shown) constitutes the gas collection means 130.

In the present embodiment, when ozone gas is supplied through the gas supply opening, the ozone gas comes to contact with the entire surface of the objective lens OB as a laminar gas fluid. The ozone gas is then sucked from the gas suction opening 131, and collected via the gas collection pipe. The optical cleaning operation by the irradiation light emitted from the irradiation light source 116 is performed under the atmosphere where ozone gas is continuously supplied to the vicinity of the surface of the objective lens OB. According to the present embodiment, in addition to the same optical cleaning enhancing effect under the ozone gas atmosphere as mentioned in Embodiment 9, such a beneficial effect is also provided that organic materials deposited on the surface of the objective lens can be oxdatively decomposed throughout the surface of the objective lens OB, due to the laminar ozone gas fluid contacting with the entire surface of the objective lens OB. Moreover, since the gas supply pipe 128 is buried in the wafer stage WST, the possibility of interference of the gas supply pipe 128 with other components during stage transfer can also be eliminated.

[Embodiment 11]

Hereinbelow, the eleventh embodiment of the present invention (Embodiment 11) will be illustrated with reference to FIG. 22. The present embodiment has the same construction as Embodiment 8, except that a gas supply means 127, a gas collection means 130 and a shield means 132 are additionally provided to the optical cleaning device 117. Therefore, only the gas supply means 127, the gas collection means 130 and the shield means 132 are explained below.

Figure 22:
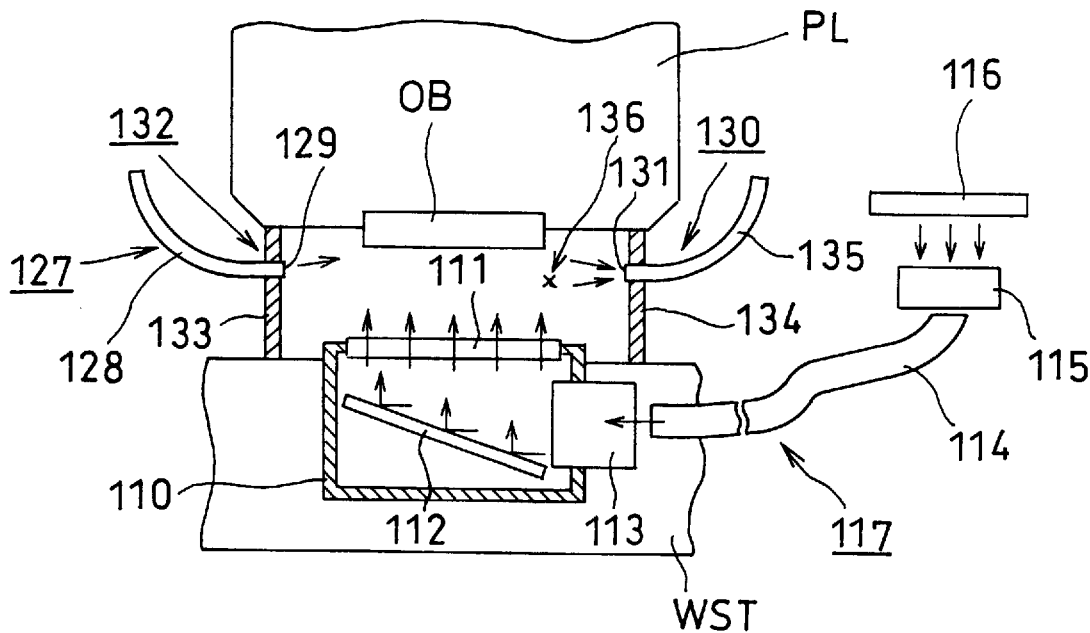
FIG. 22 is a schematic illustration of the essential part of the eleventh embodiment of the present invention.

As shown in FIG. 22, in the present embodiment, a shield means 132 is provided between the projection optical system PL and the wafer stage WST. The shield means 132 shields the atmosphere around the surface of the objective lens OB from the external atmosphere during optical cleaning of the objective lens OB by the optical cleaning device 117. The shield means 132 comprises a pair of barriers 133 and 134 with shapes of cut-halves. The gas supply pipe 128 penetrates one barrier 133, and the gas collection pipe 135 penetrates the other barrier 134. The end opening of the gas supply pipe 128 facing the inner surface of the barrier 133 is defined as a gas supply opening 129, and the end opening of the gas collection pipe 135 facing the inner surface of the barrier 134 is defined as a gas supply opening 131.

In the present embodiment, when ozone gas is fed through the gas supply opening 129 on the barrier 133 side, the ozone gas is filled in the internal space 136 defined by the both barriers 133 and 134. Under this situation, the surface of the objective lens OB is optically cleaned by the irradiated light from the irradiation light source 116. During the optical cleaning, it is appropriately performed to feed ozone gas through the gas supply opening 129 while collecting the ozone gas in the internal space 136 through the gas suction opening 131. According to the present embodiment, in addition to the same optical cleaning enhancing effects under the ozone gas atmosphere as mentioned in Embodiments 9 and 10, such a beneficial effect is also provided that the optical cleaning effect can be more increased, since it is ensured that the ozone gas atmosphere is provided in the vicinity of the surface of the objective lens OB.

[Embodiment 12]

Hereinbelow, the twelfth embodiment of the present invention (Embodiment 12) will be illustrated with reference to FIG. 23. The present embodiment also has the same construction as Embodiment 8, except that a gas supply means 127, a gas collection means 130 and a shield means 132 are additionally provided to the optical cleaning device 117. Therefore, only the gas supply means 127, the gas collection means 130 and the shield means 132 are explained below.

Figure 23:
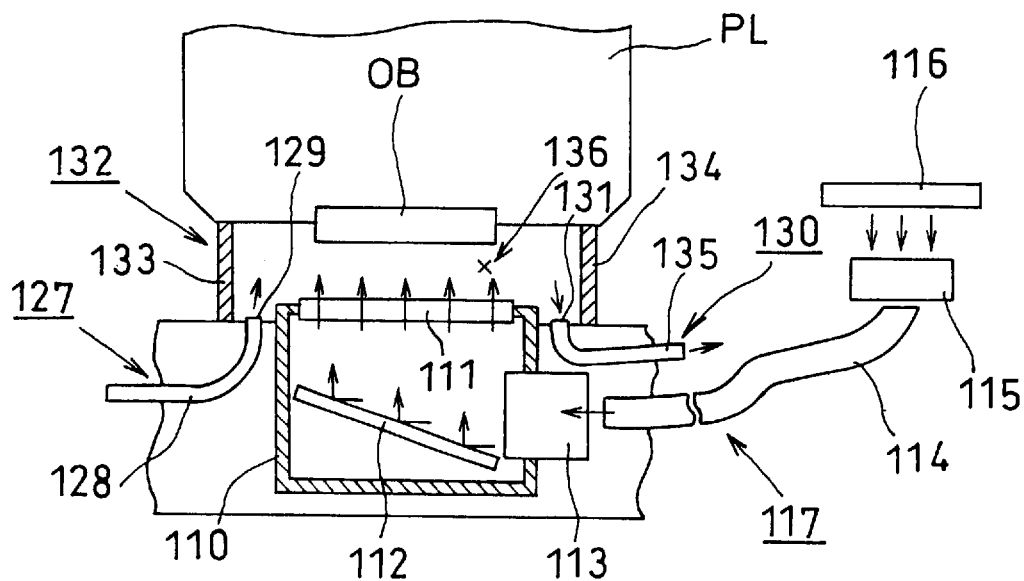
FIG. 23 is a schematic illustration of the essential part of the twelfth embodiment of the present invention.

As shown in FIG. 23, in the present embodiment, both the gas supply pipe 128 of the gas supply means 127 and a gas collection pipe 135 of a gas collection means 130 are buried on the wafer stage WST. The end opening of the gas supply pipe 128 (i.e., the gas supply opening 129) is exposed on the wafer stage WST in the vicinity of the casing 110. The end opening of the gas collection pipe 135 (i.e., the gas suction opening 131) is also exposed on the wafer stage WST on the opposite side of the gas supply opening 129 relative to the gas supply opening 129. Between the projection optical system PL and the wafer stage WST is provided a shield means 132, which is composed of a pair of barriers 133 and 134 with shapes of cut-halves. In the present embodiment, the barriers 133 and 134 are also arranged outside the gas supply opening 129 and the gas suction opening 131, respectively.

According to the present embodiment, in addition to the same effect as in Embodiment 11, such a beneficial effect is also provided that the possibility of interference of the gas supply pipe 128 and the gas collection pipe 135 with other components during stage transfer can be eliminated, since these pipes 128 and 135 are buried in the wafer stage WST.

Each of Embodiments 8–12 may be modified in the following manner.

In Embodiments 8–12, the irradiated area for the irradiation light from the irradiation light source 116 during the optical cleaning is the entire surface facing the wafer stage WST of the wafer stage WST. However, the irradiated area may be only the irradiated area for the exposure light during the projection exposure. In this case, the size of the casing 110 to be buried in the wafer stage WST can be reduced. Therefore a sufficient space can be provided over the wafer stage WST on which an alignment mark or the like are formed.

In Embodiments 8–12, the wafer stage WST is brought into a stationary state at such a position where the window 111 of the casing 110 is placed immediately beneath the objective lens OB of the projection optical system PL, and the surface of the objective lens OB is optically cleaned while keeping the wafer stage WST remains in such stationary state. However, the wafer stage WST may be designed to move relative to the projection optical system PL during the optical cleaning by the optical cleaning device 117. In this case, the irradiation area for the irradiation light emitted from the irradiation light source 116 during the optical cleaning can be reduced. Therefore, a more sufficient space can be provided over the wafer stage WST.

In Embodiments 8–12, the projection optical system inspection device 125 is designed to perform the contamination inspection repeatedly at regular intervals in accordance with control directions from the main control system during the optical cleaning operation by the optical cleaning device 117. However, the contamination inspection by the projection optical system inspection device 125 may be performed only once prior to the cleaning operation. In this case, although the determination for success/failure in contamination removal by the cleaning operation is impossible, the control operations of the projection optical system inspection device 125 by the main control can be simplified.

In Embodiments 8–12, an ArF excimer laser is used as the irradiation light source 116 of the optical cleaning device 117. However, any other type of light source may be used as long as it can generate an UV light with a wavelength of 200 nm or less capable of causing the Schumann-Runge adsorption, such as EUVLs, e.g., a xenon lump with a wavelength of 172 nm, a $F_2$ laser with a wavelength of 157 nm and a soft X-ray). Thus, the flexibility in design of the apparatus can be widened.

Figure 24:
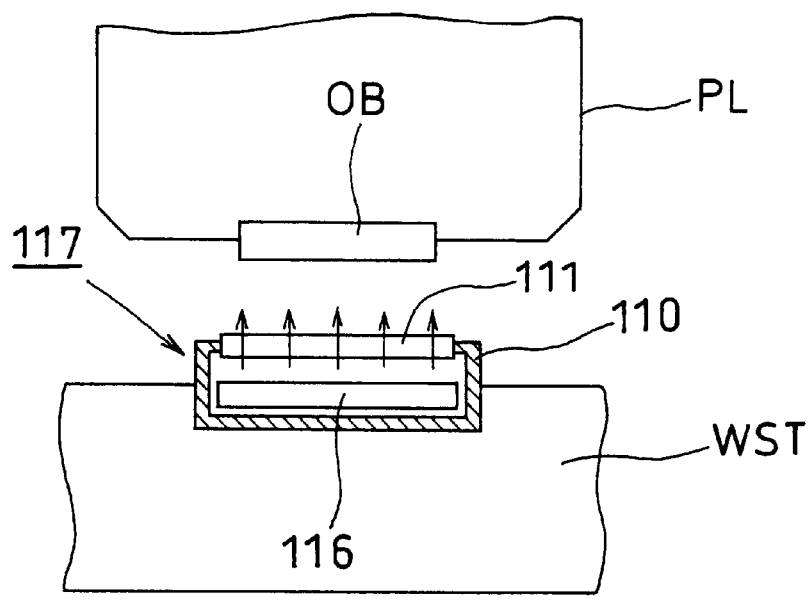
FIG. 24 is a schematic illustration of the essential part of another embodiment of the present invention.

In Embodiments 8–12, the irradiation light source 116 of the optical cleaning device 117 is provided outside of the wafer stage WST. However, as shown in FIG. 24, the irradiation light source 116 may be disposed within the casing 110 on the wafer stage WST. In this case, since an optical guide member (e.g., an optical fiber) becomes unnecessary, the configuration of the apparatus becomes correspondingly simplified, leading to reduction in cost.

In Embodiments 8–12, as the predetermined reflectance $R_0$ to be compared to a real reflectance $R_r$, an optical reflectance on the surface of the objective lens OB is employed which is determined immediately after the apparatus is manufactured. However, the predetermined reflectance $R_0$ may be the specified optical reflectance of the objective lens OB itself before assembling the apparatus. That is, the predetermined reflectance $R_0$ may be an optical reflectance of the objective lens OB which is assumed not to be contaminated to such a level that the contamination affects the optical characteristics of the projection optical system.

In Embodiments 8–12, the cleaning of the surface of the objective lens OB of the projection optical system is performed optically by the action of the irradiation light emitted from the irradiation light source 116 of the optical cleaning device 117. However, the cleaning may also be performed by an operator manually, for example, by wiping the surface of the objective lens OB. In Embodiments 11 and 12, the barriers 133 and 134 constituting the shield means 132 may be assembled and integrated into the apparatus by an operator every time the optical cleaning operation is performed, or alternatively may be retractable into the lens barrel of the projection optical system PL or the wafer stage WST by a drive means (not shown).

In Embodiments 8–12, the irradiation light source 116 of the optical cleaning device 117 is provided in addition to the exposure light source 1. However, if the exposure light source 1 employed can emit an UV light with a wavelength of 200 nm or less capable of causing the Schumann-Runge adsorption, it may double as the irradiation light source for the optical cleaning. That is, the illumination light IL emitted from the exposure light source 1 may be guided to the casing 110 on the wafer stage WST by an optical guide member (e.g., an optical fiber), and then irradiated on the surface of the objective lens OB via the mirror 112 in the same manner as in each of the embodiments. In this case, the number of the light sources to be provided in the projection exposure apparatus can be reduced, and the cost for manufacturing the apparatus can be correspondingly reduced.

Figure 25:
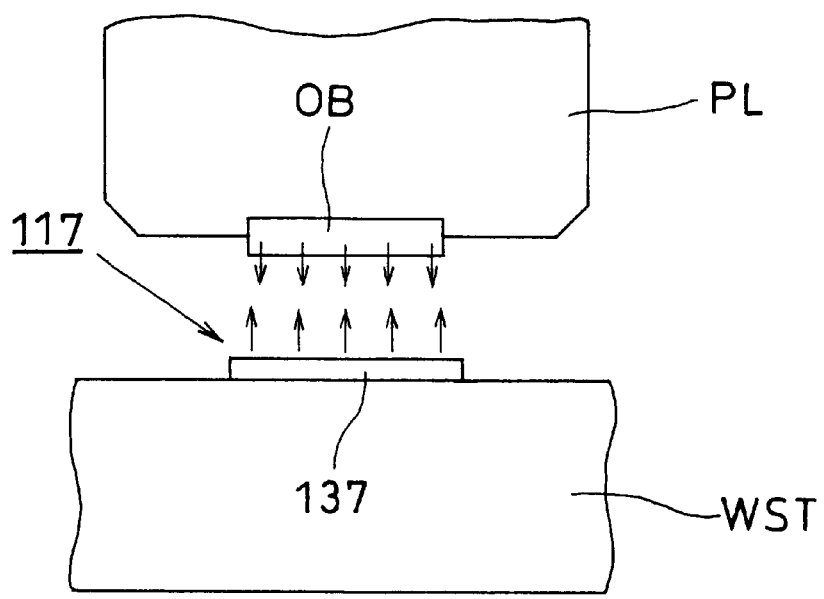
FIG. 25 is a schematic illustration of the essential part of still another embodiment of the present invention.

When the exposure light source 1 doubles as the irradiation light source for the optical cleaning, as shown in FIG. 25, a reflective mirror 137 may be mounted fixably on the wafer stage WST so that the reflective mirror 137 is irradiated with the irradiation light from the exposure light source 1 via the projection optical system PL. That is, the wafer stage is moved in such a way the reflective mirror 137 is positioned immediately beneath the objective lens OB in the projection optical system PL, and a light is then emitted from the exposure light source 1. Then, the surface of the objective lens OB is optically cleaned with both the illumination light IL from the exposure light source 1 passed through the projection optical system PL and the reflected light from the reflective mirror 137.

In this case, since both the direct illumination light and the indirect reflected light can be utilized for cleaning, the effect of the optical cleaning can be more increased. Moreover, since only the reflective mirror 137 is mounted on the wafer stage WST and therefore some components such as the casing 110 become unnecessary, the cost for manufacturing the apparatus can be more reduced.

It may also be possible that the illumination light IL from the exposure light source 1 is guided to the light emission unit 118 using an optical guide member (e.g., an optical fiber) and the optical reflectance is determined based on the illumination light IL reflected on the surface of the objective lens OB. In this way, the total number of the light source(s) applied in the projection exposure apparatus can be more reduced, and the cost for manufacturing the apparatus can also be correspondingly reduced.

In Embodiments 8–12, the irradiation light from the light emission unit 118 of the projection optical system inspection device 125 is irradiated toward the surface of the objective lens OB, and the contamination level of the surface of the objective lens OB is determined based on the real reflectance $R_r$ measured on the reflected light. However, the contamination level may be determined based on the transmitted light passed through the objective lens OB.

In this case, the light emission unit 118 is arranged so that the irradiation light passes through the objective lens OB, and the first light-receiving member 120 is arranged at the light-receiving position for the transmitted light passed through the objective lens OB. Between the light emission unit 118 and the objective lens OB, the diverging mirror 119 is arranged on the optical path of the irradiation light from the light emission unit 118 and the second light-receiving member 121 is arranged at the light-receiving position for the diverged light from the diverging mirror 119. The computation unit 123 in the inspection control system 122 computes the optical transmittance of the objective lens OB as a real transmittance based on the photoelectric signals output from the light-receiving members 120 and 121. Based on the comparison result between the real transmittance and the predetermined transmittance previously stored in the memory 124, the contamination level is determined. In this way, the same effect as that in each of the above-described embodiments can be provided.

In Embodiments 8–12, the pattern defined on the mask is exposed to light under the condition where the mask and the substrate are statistic and then imaged by a step-and-repeat type of projection exposure apparatus in which the substrate is moved sequentially. However, a scanning type of projection exposure apparatus may also be applicable in which the mask and the substrate are synchronously moved to projected the pattern on the mask to light. The exposure apparatus is not particularly limited to one suited for manufacturing semiconductors, and any other type of exposure apparatus may also be employed, such as one suited for manufacturing liquid crystal display devices in which a liquid crystal display device pattern is projected onto a rectangular glass plate and one suited for manufacturing thin-film magnetic heads.

The contamination inspection device and the cleaning device (optical cleaning device) described in Embodiments 8–12 may be used in combination with any of Embodiments 1–7 or replaced with those used in the other embodiment. For example, the contamination inspection device of FIG. 14 may be replaced with that shown in FIG. 19, or the cleaning device of FIG. 14 may be replaced with that shown in FIG. 19.

The exposure apparatus of the present invention may be applicable to a proximity exposure apparatus in which a pattern on a mask is exposed to light while closely contacting the mask and a substrate without the use of a projection optical system. As the light source, a KrF excimer laser (248 nm), an ArF excimer laser (193 nm) or a $F_2$ laser (157 nm) may be used. Any magnification ratio may be available in the projection optical system, including reducing ratios, an equivalent ratio and magnifying ratios. In the projection optical system, when a far ultraviolet ray such as an excimer laser is used, a material capable of transmitting the far ultraviolet ray is preferably used as the glassy material, such as quartz and fluorite; and when a $F_2$ laser or X-ray is used as the light source, a catadioptric optical system may be used, where a reflector-type of reticle is chosen as the reticle.

The projection exposure apparatus of the present invention can be manufactured by integrating an illumination optical system and a projection optical system comprising a plurality of lenses into the main body of an exposure apparatus and optically adjusting these systems; installing a reticle stage and a wafer stage comprising a number of mechanical parts into the exposure apparatus, carrying out wiring and piping installations; and finally carrying out the total adjustment (e.g., electrical adjustment, operational verification, etc.) of the entire apparatus. The manufacture of the exposure apparatus is preferably performed in a clean room where the room temperature, the cleanliness and so on are controlled.

A semiconductor device can be manufactured by a process comprising: a step for designing the function and the performance of the device; a step for manufacturing a reticle in accordance with the device design; a step for manufacturing a wafer from a silicon material; a step for projecting a pattern on the reticle onto the wafer by the exposure apparatus of any of the above-mentioned embodiments; a step for assembling the device (including dicing, bonding and packaging); a step for inspection of the finished device; and so on.

What is claimed is:

1. A projection exposure apparatus for transferring a pattern defined on a mask onto a substrate via a projection optical system, comprising:

a cleaning device that cleans an optical member disposed at a given position, wherein the cleaning device is disposed on a stage for holding the substrate.

2. The projection exposure apparatus according to claim 1, wherein the cleaning device comprises an ultrasonic cleaning device configured to ultrasonically clean a part of the optical member by immersing the part of the optical member in a cleaning ultrasonic vibration.

3. The projection exposure apparatus according to claim 1, wherein the cleaning device comprises a cleaning member which contacts the substrate-opposed surface of the optical member.

4. The projection exposure apparatus according to claim 1, wherein the cleaning device comprises a solution injector that emits a cleaning solution onto the substrate-opposed surface of the optical member.

5. The projection exposure apparatus according to claim 1, wherein the optical member is one disposed on an optical path of an exposure illumination light and in a vicinity of the substrate.

6. The projection exposure apparatus according to claim 1, wherein the optical member is, among a plurality of optical elements constituting a projection optical system, an optical element disposed in a vicinity of the substrate.

7. The projection exposure apparatus according to claim 1, wherein the optical member is one disposed at an end part of an optical system for alignment of the substrate.

8. The projection exposure apparatus according to claim 1, wherein the apparatus includes a contamination inspection device that inspects the optical member for contamination.

9. The projection exposure apparatus according to claim 8, wherein the cleaning device comprises a judging unit connected to the contamination inspection device to determine whether or not cleaning of the optical member is necessary, based on the inspection result from the contamination inspection device.

10. The projection exposure apparatus according to claim 1, wherein the cleaning device is mounted on the stage at a different position from that for holding the substrate.

11. The projection exposure apparatus according to claim 10, wherein the optical member is, among a plurality of optical elements constituting a projection optical system, an optical element disposed in a vicinity of the substrate.

12. The projection exposure apparatus according to claim 10, wherein the cleaning device comprises an optical cleaning device that irradiates an irradiation light having an optical cleaning effect onto contamination and is disposed on a stage for holding the substrate.

13. A projection exposure apparatus for transferring a pattern defined on a mask onto a substrate via a projection optical system, comprising:

a cleaning device that cleans an optical member disposed at a given position, wherein the cleaning device is mounted on a vertical movement drive device provided on the stage.

14. A projection exposure apparatus for transferring a pattern defined on a mask onto a substrate via a projection optical system, comprising:

a cleaning device that cleans an optical member disposed at a given position, wherein the cleaning device is disposed on a stage for holding the substrate, and the cleaning device comprises an optical cleaning device that irradiates an irradiation light having an optically cleaning effect onto the surface of the optical member.

15. The projection exposure apparatus according to claim 14, wherein the optical cleaning device comprises a gas supply device that supplies an oxidation-enhancing gas in the vicinity of the surface of the optical member.

16. The projection exposure apparatus according to claim 15, wherein the optical cleaning device comprises a shield member disposed in the vicinity of the optical member to shield the atmosphere in the vicinity of the surface of the optical member, against the external environment.

17. The projection exposure apparatus according to claim 14, wherein the optical cleaning device is adapted to irradiate the irradiation light onto the optical member through a replaceable window.

18. The projection exposure apparatus according to claim 14, wherein the optical member is, among a plurality of optical elements constituting the projection optical system, an optical element disposed in a vicinity of the substrate.

19. A projection exposure method for transferring a pattern defined on a mask onto a substrate via a projection optical system, the method comprising:

cleaning contamination from an optical member using a cleaning device disposed on a stage holding the substrate; and transferring the pattern defined on the mask onto the substrate via the projection optical system.

20. The projection exposure method according to claim 19, wherein the optical member is one disposed on the optical path of the exposure illumination light close to the substrate.

21. The projection exposure method according to claim 19, wherein the method further comprises, prior to the cleaning step, determining the relation between the contamination level of the optical member and the number of pattern transfer operations and then determining the limit in number of pattern transfer operations, which is the number of exposure operations during which the clean substrate-opposed surface of the optical member is contaminated to a predetermined impermissible level; and the cleaning step is performed before the number of pattern transfer operations performed after the previous cleaning step exceeds the limit.

22. A projection exposure method for transferring a pattern defined on a mask onto a substrate via a projection optical system, the method comprising:

cleaning contamination from an optical member using a cleaning device disposed at a given position on a stage for holding the substrate; and transferring a pattern defined on the mask onto the substrate via the projection optical system, wherein the cleaning step comprises irradiating an irradiation light having an optical cleaning effect onto the contamination on the optical member.

23. A method for making a projection exposure apparatus for transferring a pattern defined on a mask onto the substrate via a projection optical system, the method comprising:

providing a stage holding the substrate with a cleaning device configured to clean an optical member as a part of the projection exposure apparatus.

24. A method for assembling a projection exposure for transferring a pattern defined on a mask to a substrate via a projection optical system, the method comprising:

providing a cleaning device that cleans an optical member as a part of the projection exposure apparatus, wherein the cleaning device is an optical cleaning device that irradiates an irradiation light having an optical cleaning effect onto contamination on the optical member and is disposed on a stage for holding the substrate.

25. The method according to claim 24, wherein the method further comprises providing a contamination inspection device that inspects the optical member for contamination, to the projection exposure apparatus.

* * * * *